United States Patent
Kikitsu et al.

(10) Patent No.: US 12,259,446 B2
(45) Date of Patent: Mar. 25, 2025

(54) SENSOR AND INSPECTION DEVICE

(71) Applicant: KABUSHIKI KAISHA TOSHIBA, Tokyo (JP)

(72) Inventors: Akira Kikitsu, Yokohama Kanagawa (JP); Yoshihiro Higashi, Komatsu Ishikawa (JP); Satoshi Shirotori, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 18/164,471

(22) Filed: Feb. 3, 2023

(65) Prior Publication Data
US 2024/0003998 A1 Jan. 4, 2024

(30) Foreign Application Priority Data
Jul. 4, 2022 (JP) .................................. 2022-107817

(51) Int. Cl.
*G01R 33/09* (2006.01)
(52) U.S. Cl.
CPC .................................. *G01R 33/09* (2013.01)
(58) Field of Classification Search
CPC ...... G01R 33/09; G01R 33/02; G01R 33/091; G01R 33/093; G01R 33/098
(Continued)

(56) References Cited

U.S. PATENT DOCUMENTS

| | | | |
|---|---|---|---|
| 2015/0061658 A1* | 3/2015 | Zimmer | H04L 47/781 324/207.25 |
| 2017/0363606 A1 | 12/2017 | Kikitsu et al. | |

(Continued)

FOREIGN PATENT DOCUMENTS

| | | | | |
|---|---|---|---|---|
| CN | 110308409 A | * | 10/2019 | G01D 5/145 |
| JP | 2002-277522 A | | 9/2002 | |

(Continued)

OTHER PUBLICATIONS

Djamal et al., Effect of Cu Layer Thickness on Giant Magnetoresistance Properties of NiCoFe/Cu/NiCoFe Sandwich, 2009 ICROS-SICE Int'l Joint Conf. 395 (Aug. 18-21, 2009). (Year: 2009).*

*Primary Examiner* — Tung X Nguyen
*Assistant Examiner* — Robert P Alejnikov, Jr.
(74) *Attorney, Agent, or Firm* — Finnegan, Henderson, Farabow, Garrett & Dunner, LLP

(57) ABSTRACT

According to one embodiment, a sensor includes an element portion including a first element. The first element includes a first magnetic element, a first conductive member, and a first magnetic portion. The first magnetic element includes a first magnetic layer and a first opposing magnetic layer. A length of the first magnetic element along a second direction crossing a first direction from the first magnetic layer to the first opposing magnetic layer is longer than a length of the first magnetic element along a third direction crossing a plane including the first direction and the second direction. The first conductive member includes a first conductive portion and a first other conductive portion. A direction from the first other conductive portion to the first conductive portion is along the second direction. A direction from the first magnetic portion to the first magnetic element is along the second direction.

20 Claims, 29 Drawing Sheets

(58) Field of Classification Search
USPC .......................................................... 324/252
See application file for complete search history.

(56) References Cited

U.S. PATENT DOCUMENTS

| | | | |
|---|---|---|---|
| 2018/0271395 A1 | 9/2018 | Iwasaki et al. | |
| 2019/0369172 A1 | 12/2019 | Kikitsu et al. | |
| 2020/0066790 A1* | 2/2020 | Lassalle-Balier | ...... H10N 50/10 |
| 2022/0065955 A1 | 3/2022 | Kikitsu et al. | |

FOREIGN PATENT DOCUMENTS

| | | | | |
|---|---|---|---|---|
| JP | 2005-315812 A | 11/2005 | | |
| JP | 2015-197388 A | 11/2015 | | |
| JP | 2018-155719 A | 10/2018 | | |
| JP | 2019-207167 A | 12/2019 | | |
| JP | 6668176 B2 | 3/2020 | | |
| JP | 2022-37688 A | 3/2022 | | |
| WO | WO-2013118498 A1 * | 8/2013 | ......... | G01R 33/0206 |
| WO | WO-2014156108 A1 * | 10/2014 | ......... | G01R 33/0206 |

\* cited by examiner

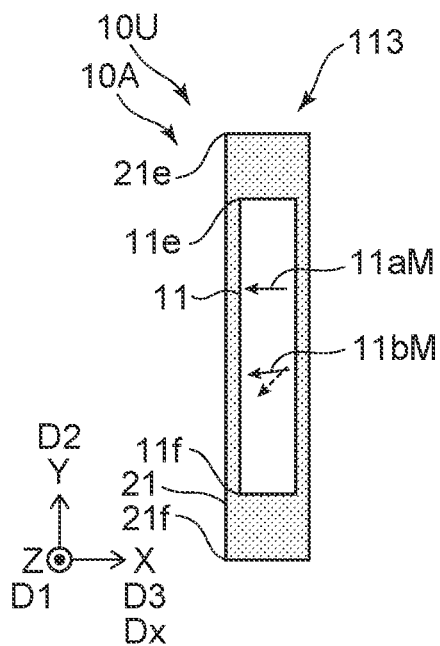
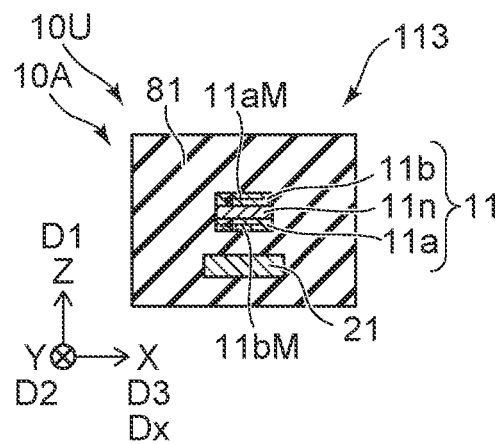
FIG. 10A
FIG. 10B
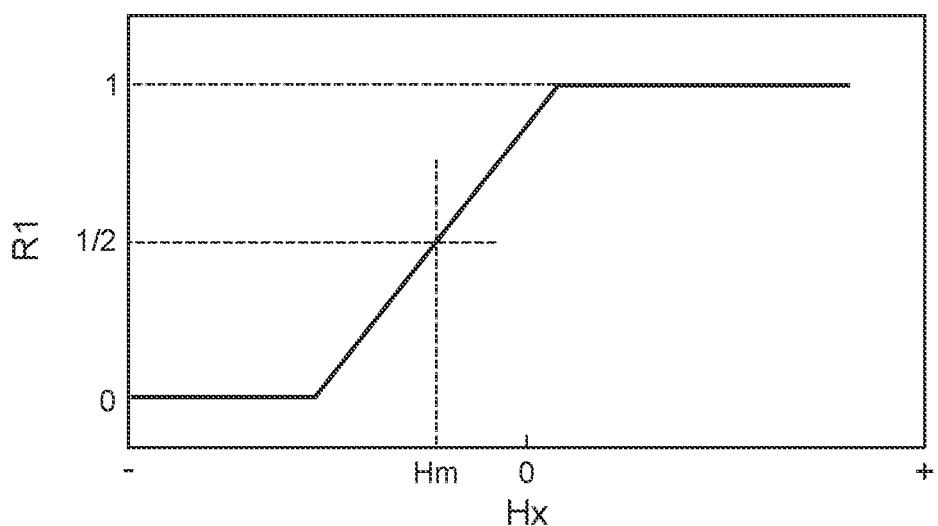
FIG. 10C

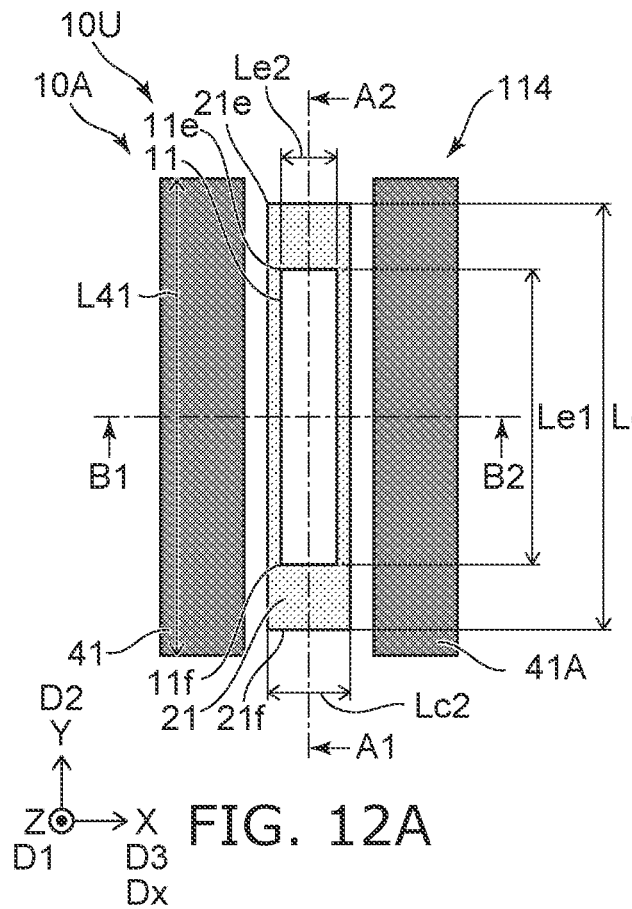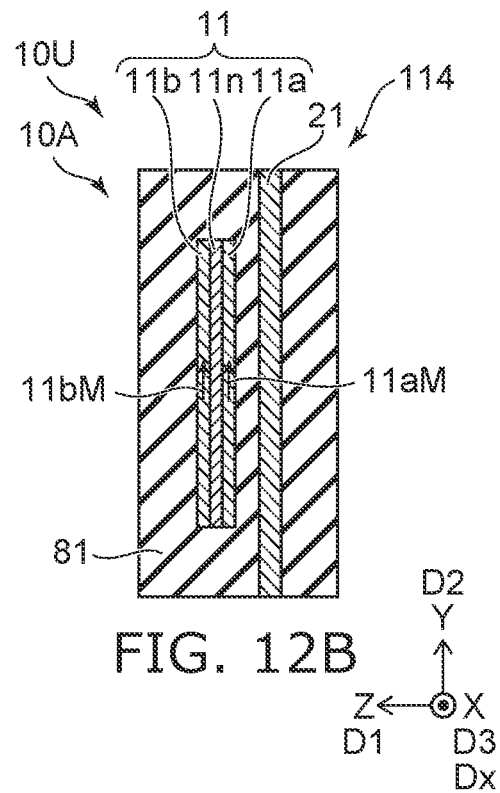
FIG. 12A
FIG. 12B
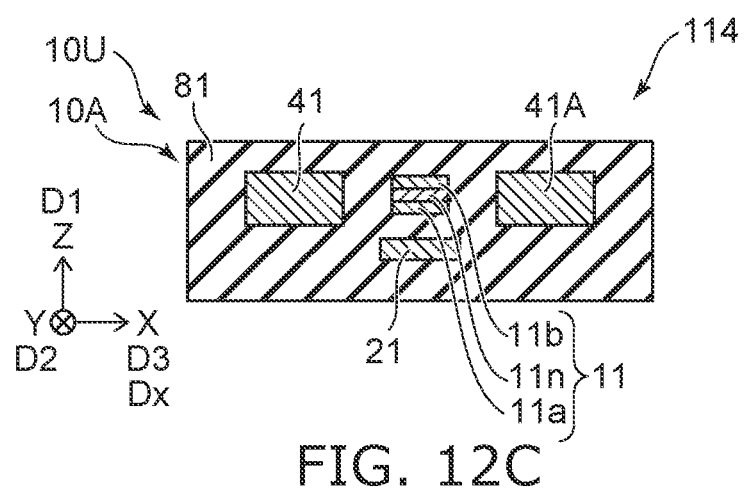
FIG. 12C

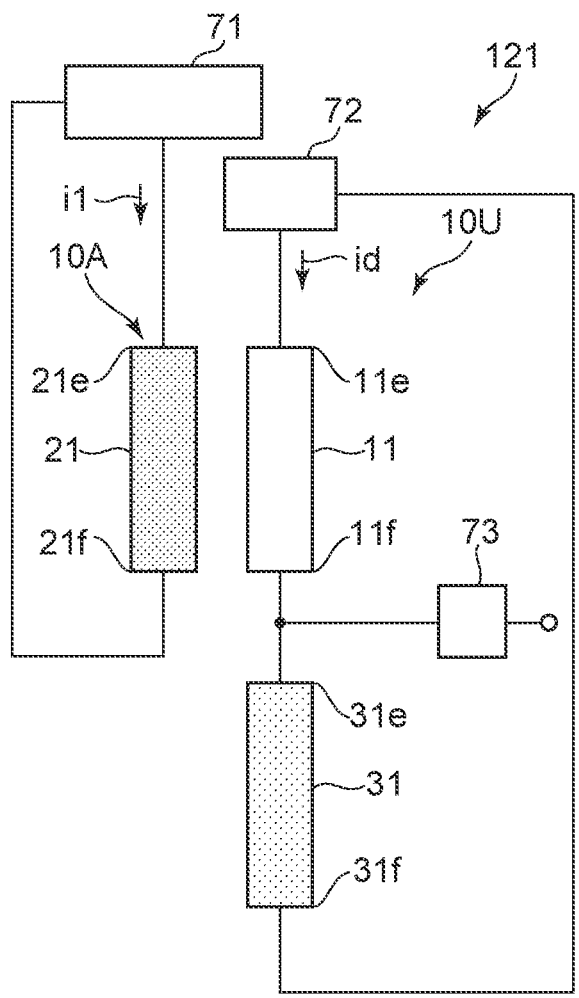
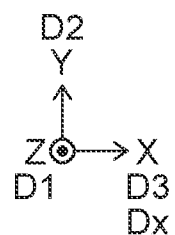
FIG. 13

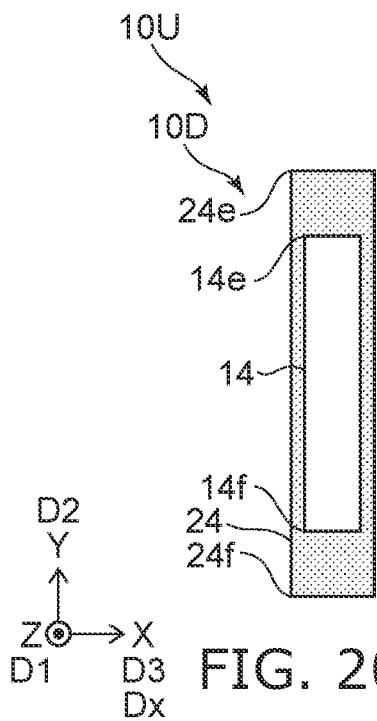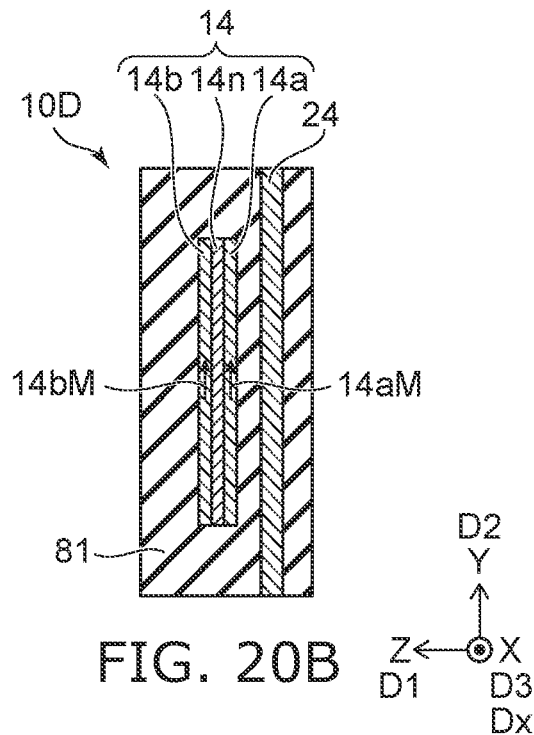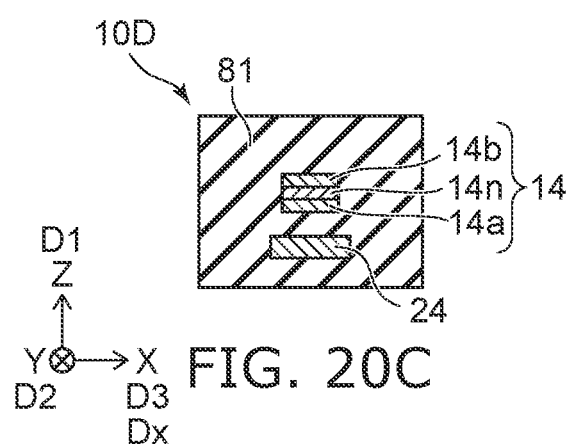

SENSOR AND INSPECTION DEVICE

CROSS-REFERENCE TO RELATED APPLICATIONS

This application is based upon and claims the benefit of priority from Japanese Patent Application No. 2022-107817, filed on Jul. 4, 2022; the entire contents of which are incorporated herein by reference.

FIELD

Embodiments described herein generally relate to a sensor and an inspection device.

BACKGROUND

For example, there is a sensor using a magnetic layer. It is desired to improve the characteristics of the sensor.

BRIEF DESCRIPTION OF THE DRAWINGS

FIGS. 10A to 10C are schematic views illustrating a sensor according to the first embodiment;
FIGS. 12A to 12C are schematic views illustrating the sensor according to the first embodiment;
FIG. 13 is a schematic view illustrating a sensor according to the first embodiment;
FIGS. 20A to 20C are schematic views illustrating a sensor according to the first embodiment.

DETAILED DESCRIPTION

Figure 1:
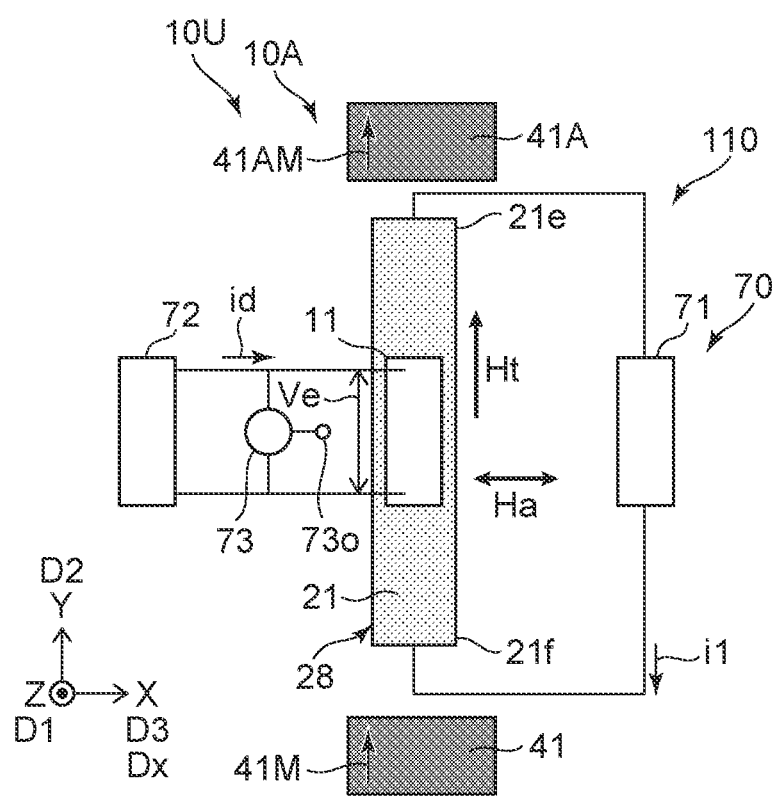
FIG. 1 is a schematic view illustrating a sensor according to a first embodiment.

According to one embodiment, a sensor includes an element portion including a first element. The first element includes a first magnetic element, a first conductive member, and a first magnetic portion. The first magnetic element includes a first magnetic layer and a first opposing magnetic layer. A length of the first magnetic element along a second direction crossing a first direction from the first magnetic layer to the first opposing magnetic layer is longer than a length of the first magnetic element along a third direction crossing a plane including the first direction and the second direction. The first conductive member includes a first conductive portion and a first other conductive portion. A direction from the first other conductive portion to the first conductive portion is along the second direction. A direction from the first magnetic portion to the first magnetic element is along the second direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1 and 2A to 2C are schematic views illustrating a sensor according to a first embodiment.

Figure 2A:
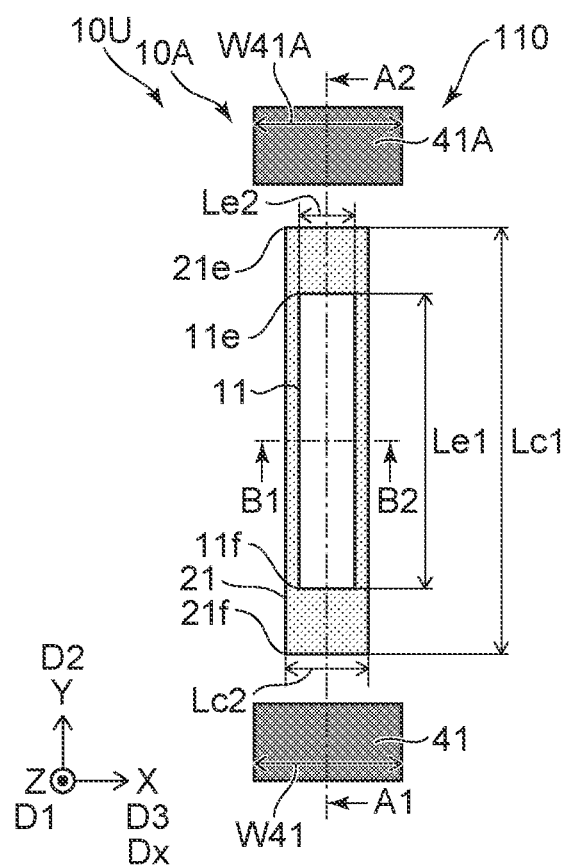
FIGS. 2A to 2C are schematic views illustrating the sensor according to the first embodiment.
Figure 2B:
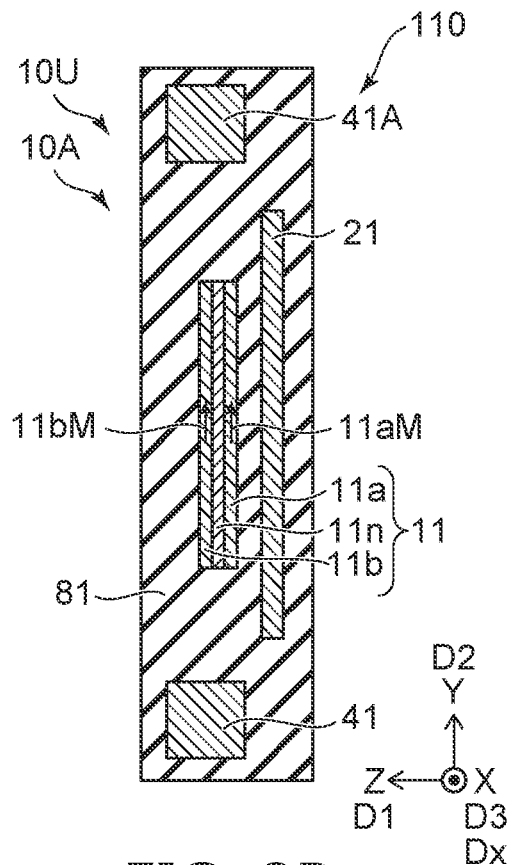
Figure 2C:
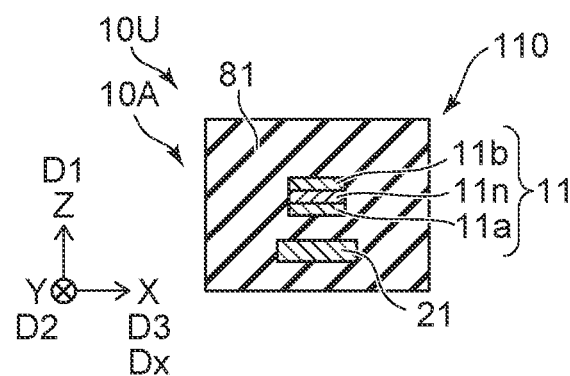

FIG. 2A is a plan view. FIG. 2B is a cross-sectional view taken along the line A1-A2 of FIG. 2A. FIG. 2C is a cross-sectional view along the line B1-B2 of FIG. 2A.

As shown in FIG. 1, a sensor 110 according to the embodiment includes an element portion 10U. The element portion 10U includes the first element 10A.

The first element 10A includes a first magnetic element 11, a first conductive member 21 and a first magnetic portion 41. As shown in FIGS. 2B and 2C, the first magnetic element 11 includes a first magnetic layer 11a and a first opposing magnetic layer 11b.

A first direction D1 from the first magnetic layer 11a to the first opposing magnetic layer 11b is defined as a Z-axis direction. One direction perpendicular to the Z-axis direction is defined as a Y-axis direction. The direction perpendicular to the Z-axis direction and the Y-axis direction is defined as an X-axis direction.

As shown in FIG. 2A, a length of the first magnetic element 11 along the second direction D2 crossing the first direction D1 is defined as a length Le1. The second direction D2 is, for example, the Y-axis direction. A length of the first magnetic element 11 along a third direction D3 is defined as a length Le2. The third direction D3 crosses a plane including the first direction D1 and the second direction D2. The third direction D3 is, for example, the X-axis direction. The length Le1 is longer than the length Le2. In the first magnetic element 11, the length Le1 is the length of the magnetization free layer included in the first magnetic element 11 in an easy axis direction. In the first magnetic element 11, the length Le2 is the length of the magnetization free layer included in the first magnetic element 11 in a hard axis direction.

As shown in FIG. 1, the first conductive member 21 includes a first conductive portion 21e and a first other conductive portion 21f. A direction from the first other conductive portion 21f to the first conductive portion 21e is along the second direction D2.

As shown in FIG. 2A, the first magnetic element 11 includes a first element portion 11e and a first other element portion 11f. A direction from the first other element portion 11f to the first element portion 11e is along the second direction D2. The length Le1 corresponds to, for example, the distance between the first element portion 11e and the first other element portion 11f.

The first element portion 11e corresponds to the first conductive portion 21e. The first other element portion 11f corresponds to the first other conductive portion 21f. The distance between the first element portion 11e and the first conductive portion 21e is shorter than the distance between the first element portion 11e and the first other conductive portion 21f. The distance between the first other element portion 11f and the first other conductive portion 21f is shorter than the distance between the first other element portion 11f and the first conductive portion 21e.

As shown in FIG. 1, the direction from the first magnetic portion 41 to the first magnetic element 11 is along the second direction D2.

The first magnetic portion 41 can apply a bias magnetic field to the first magnetic element 11. The magnetization of the magnetic layers included in the first magnetic element 11 can be controlled by the bias magnetic field.

As shown in FIG. 1, for example, a target magnetic field Ht is applied to the first magnetic element 11. The target magnetic field Ht includes a component along the second direction D2. The electrical resistance of the first magnetic element 11 changes according to the target magnetic field Ht. The target magnetic field Ht can be detected by detecting a change in electrical resistance.

Figure 3A:
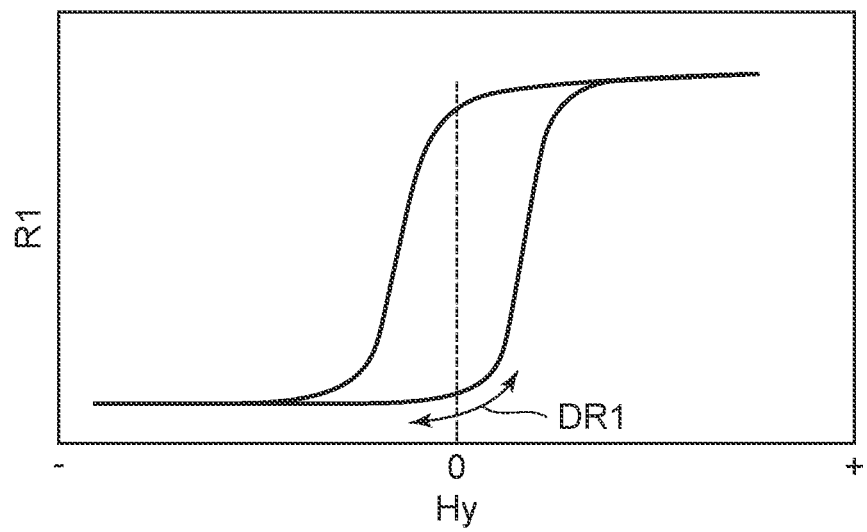
FIGS. 3A and 3B are graphs illustrating the characteristics of the sensor.
Figure 3B:
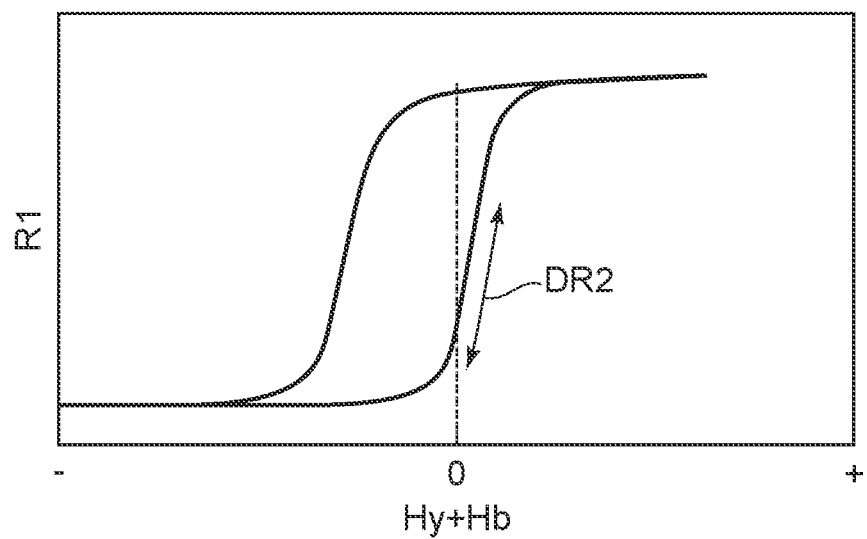

FIGS. 3A and 3B are graphs illustrating the characteristics of the sensor.

FIG. 3A illustrates the characteristics of the first magnetic element 11. The horizontal axis of FIG. 3A is the magnetic field Hy applied to the first magnetic element 11. The magnetic field Hy is along the second direction D2. The vertical axis is the first electrical resistance R1 of the first magnetic element 11. The first electrical resistance R1 corresponds to the voltage Ve (see FIG. 1) across the first magnetic element 11.

As shown in FIG. 3A, for example, there is a case where the rate of change of the first electrical resistance R1 with respect to the magnetic field Hy applied to the first magnetic element 11 may not be constant with respect to the magnitude of the magnetic field Hy. In this example, when the absolute value of the magnetic field Hy is small, the change rate of the first electrical resistance R1 is low. On the other hand, when the absolute value of the magnetic field Hy is large, the change rate of the first electrical resistance R1 is high. For example, when the target magnetic field Ht is in the range DR1, the change in the first electrical resistance R1 is small.

FIG. 3B illustrates characteristics when the bias magnetic field Hb by the first magnetic portion 41 is applied to the first magnetic element 11. The horizontal axis of FIG. 3A is the sum of the magnetic field Hy and the bias magnetic field Hb. The vertical axis is the first electrical resistance R1 of the first magnetic element 11.

As shown in FIG. 3B, when the bias magnetic field Hb is applied to the first magnetic element 11, the first electrical resistance R1 shifts from the characteristic shown in FIG. 3A. For example, when the sum of the target magnetic field Ht and the bias magnetic field Hb is within the range DR2, a large change in the first electrical resistance R1 can be obtained.

Thus, in the embodiment, the first magnetic portion 41 is provided. The bias magnetic field Hb is applied to the first magnetic element 11 by the first magnetic portion 41. As a result, the effect of shifting the target magnetic field Ht can be obtained. Due to the bias magnetic field Hb, the target magnetic field Ht can be detected in a region where the rate of change of the first electrical resistance R1 of the first magnetic element 11 is high. For example, high detection sensitivity can be obtained. According to the embodiment, it is possible to provide a sensor with improved characteristics.

As shown in FIG. 2A, the length of the first magnetic portion 41 along the third direction D3 is defined as a length W41. The length W41 is longer than the length Le2 (the length of the first magnetic element 11 along the third direction D3). As a result, the magnetic field from the first magnetic portion 41 can be uniformly and effectively applied to the first magnetic element 11.

The first magnetic portion 41 includes a ferromagnetic material, for example. The first magnetic portion 41 includes at least one selected from the group consisting of Fe and Co, for example.

As shown in FIG. 1, the first element 10A may further include a first opposing magnetic portion 41A. At least a part of the first magnetic element 11 is located between the first magnetic portion 41 and the first opposing magnetic portion 41A in the second direction D2. The bias magnetic field Hb is more uniformly and effectively applied to the first magnetic element 11 by the first magnetic portion 41 and the first opposing magnetic portion 41A. The material of the first opposing magnetic portion 41A may be the same as that of the first magnetic portion 41.

An orientation of the magnetization 41M of the first magnetic portion 41 includes a component in the second direction D2. An orientation of the magnetization 41MA of the first opposing magnetic portion 41A includes a component in the second direction D2. The orientation of the magnetization 41M of the first magnetic portion 41 is the same as the orientation of the magnetization 41AM of the first opposing magnetic portion 41A.

As shown in FIG. 2A, a length of the first opposing magnetic portion 41A along the third direction D3 is defined as a length W41A. The length W41A is longer than the length Le2 (the length of the first magnetic element 11 along the third direction D3). The bias magnetic field Hb can be uniformly and effectively applied to the first magnetic element 11.

As shown in FIG. 1, a controller 70 is provided. The controller 70 may be included in sensor 110. The controller 70 may be provided separately from the sensor 110. The controller 70 includes a first circuit 71.

The first circuit 71 is electrically connected to the first conductive portion 21e and the first other conductive portion 21f. The first circuit 71 is configured to supply the first current i1 to the first conductive member 21. The first current i1 includes an AC component.

As described below, the first current i1 may include a DC bias. For example, the local maximum and local minimum values of the first current i1 may have the same polarity. For example, the first current i1 never becomes 0 in an alternating change. This makes the magnetization of the magnetic layer included in the first magnetic element 11 more stable.

The first magnetic field Ha is generated from the first conductive member 21 by the first current i1 flowing through the first conductive member 21. The first magnetic field Ha is along the cross direction Dx crossing the plane including the first direction D1 and the second direction D2. The cross direction Dx corresponds to the third direction D3. The first conductive member 21 is one example of the magnetic field generator 28. A first magnetic field Ha along the cross direction Dx is generated from the magnetic field generator 28.

The first magnetic field Ha is applied to the first magnetic element 11. The first electrical resistance R1 of the first magnetic element 11 changes according to the change in the first current i1. The first electrical resistance R1 of the first magnetic element 11 changes according to both the target magnetic field Ht and the first magnetic field Ha. By processing a signal corresponding to the first electrical resistance R1 based on the frequency of the AC component of the first current i1, the target magnetic field Ht can be detected with higher accuracy.

As shown in FIG. 1, the controller 70 may include a second circuit 72 and a third circuit 73. The second circuit 72 is configured to supply a detection current id to the first magnetic element 11. The third circuit 73 is configured to detect a value corresponding to the change in the first electrical resistance R1 of the first magnetic element 11. A value corresponding to the change in the first electrical resistance R1 is, for example, the voltage Ve. The voltage Ve changes according to the target magnetic field Ht. The signal corresponding to the target magnetic field Ht is obtained from the output portion 73o of the third circuit 73. The detection current id may be, for example, a direct current.

As shown in FIGS. 2B and 2C, the first magnetic element 11 may include a first non-magnetic layer 11n. The first non-magnetic layer 11n is provided between the first magnetic layer 11a and the first opposing magnetic layer 11b.

As shown in FIG. 2B, in this example, the magnetization 11aM of the first magnetic layer 11a is along the second direction D2 when the first current i1 is not flowing. The magnetization 11bM of the first opposing magnetic layer 11b is along the second direction D2. In the embodiments, the magnetization 11aM may cross the magnetization 11bM. In the embodiments, the first magnetic layer 11a may be, for example, one of a reference layer and a magnetization free layer. The first opposing magnetic layer 11b may be, for example, the other of the reference layer and the magnetization free layer. The reference layer is, for example, a pinned layer.

The change in the first electrical resistance R1 of the first magnetic element 11 is based on the change in the angle between the magnetization 11aM and the magnetization 11bM according to the magnetic field applied to the first magnetic element 11, for example.

As shown in FIGS. 2B and 2C, for example, the direction from the first conductive member 21 to the first magnetic element 11 is along the first direction D1. In this example, the first magnetic layer 11a is between the first conductive member 21 and the first opposing magnetic layer 11b. In embodiments, the first opposing magnetic layer 11b may be between the first conductive member 21 and the first magnetic layer 11a.

In embodiments, the first non-magnetic layer 11n may be conductive. The first non-magnetic layer 11n includes, for example, Cu. The first magnetic element functions as a GMR (Giant Magnetoresistance effect) element. The first non-magnetic layer 11n may be non-conductive. The first non-magnetic layer 11n includes, for example, MgO. The first magnetic element functions as a TMR (Tunnel Magneto Resistance effect) element.

As shown in FIGS. 2B and 2C, the first element 10A may include a first insulating member 81. At least a part of the first insulating member 81 is provided between the first magnetic element 11 and the first conductive member 21. The first insulating member 81 electrically insulates between the first magnetic element 11 and the first conductive member 21.

In the embodiment, the orientation of the magnetization of the magnetization free layer (for example, the first magnetic layer 11a) included in the first magnetic element 11 is changed by the first magnetic field Ha. The first magnetic field Ha is along the cross direction Dx (for example, the third direction D3). The target magnetic field Ht includes a component in a direction which crosses the cross direction Dx (for example, the second direction D2). The component of the target magnetic field Ht in the second direction D2 affects the orientation of magnetization by the first magnetic field Ha. The target magnetic field Ht can be detected by detecting a change in the first electrical resistance R1 based on the orientation of magnetization.

For example, when a second direction magnetic field having a component in the second direction D2 is applied to the first magnetic element 11, the change in the first electrical resistance R1 is large. On the other hand, when a third direction magnetic field having a component in the cross direction Dx (third direction D3) is applied to the first magnetic element 11, the change in the first electrical resistance R1 is small. The rate of change of the first electrical resistance R1 with respect to the change in the second direction magnetic field is higher than the rate of change of the first electrical resistance R1 with respect to the change in the third direction magnetic field.

Figure 4A:
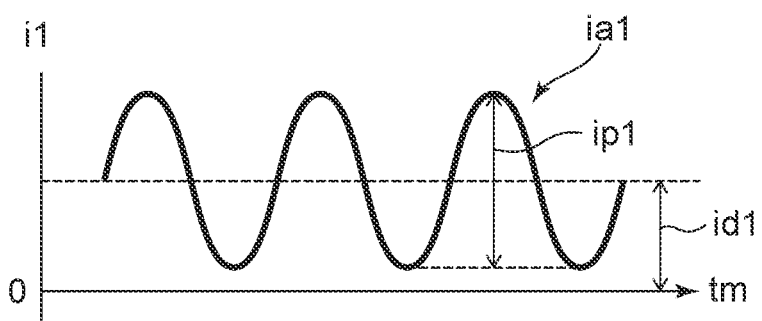
FIGS. 4A and 4B are schematic diagrams illustrating the operation of the sensor according to the first embodiment.
Figure 4B:
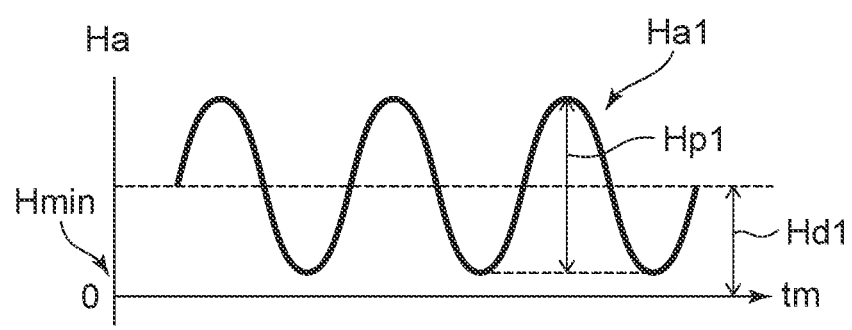

FIGS. 4A and 4B are schematic diagrams illustrating the operation of the sensor according to the first embodiment.

FIG. 4A illustrates the first current i1. The horizontal axis of FIG. 4A is time tm. The vertical axis of FIG. 4A is the value of the first current i1. As shown in FIG. 4A, the first current i1 includes an AC component ia1. The local minimum value of the first current i1 has the first polarity and the local maximum value of the first current i1 has the first polarity.

For example, the first polarity is one of positive and negative. An example in which the first polarity is positive will be described below.

For example, the first current i1 includes an AC component ia1 and a DC component id1. The DC component id1 is larger than ½ of the amplitude ip1 of the AC component ia1. For the first current i1, the difference between the local minimum and local maximum values corresponds to the amplitude ip1. In the embodiments, both the local minimum value and local maximum value are of the first polarity (e.g., positive). The first current i1 never becomes the second polarity (e.g., negative). The first current i1 never becomes zero.

The first magnetic field Ha is generated by the first current i1. FIG. 4B illustrates the first magnetic field Ha. The horizontal axis of FIG. 4B is time tm. The vertical axis of FIG. 4B is the strength of the first magnetic field Ha. As shown in FIG. 4B, the first magnetic field Ha includes an alternating magnetic field component Ha1. The local minimum value of the first magnetic field Ha is of the first polarity and the local maximum value of the first magnetic field Ha is of the first polarity.

For example, the first magnetic field Ha includes an AC magnetic field component Ha1 and a DC magnetic field component Hd1. The DC magnetic field component Hd1 is larger than ½ of the amplitude Hp1 of the AC magnetic field component Ha1. In the first magnetic field Ha, the difference between the local minimum value and the local maximum value corresponds to the amplitude Hp1. In embodiments, both the local minimum value and local maximum values are of the first polarity (e.g., positive). The first magnetic field Ha never becomes the second polarity (e.g., negative). The first magnetic field Ha never becomes zero. The local minimum value Hmin of the first magnetic field Ha is the difference between the DC magnetic field component Hd1 and ½ of the amplitude Hp1 of the AC magnetic field component Ha1. In the embodiments, for example, the local minimum Hmin of the first magnetic field Ha is positive.

The first electrical resistance R1 of the first magnetic element 11 changes according to the change in the first magnetic field Ha. The change in the first electrical resistance R1 is due to, for example, the MR effect (magnetoresistance effect). For example, the first electrical resistance R1 of the first magnetic element 11 changes according to the change in the first current i1.

The target magnetic field Ht is applied to the first magnetic element 11. The first electrical resistance R1 of the first magnetic element 11 also changes depending on the magnetic field Ht. The first electrical resistance R1 changes according to both the first current i1 (and the first magnetic field Ha) and the target magnetic field Ht. In the embodiment, the target magnetic field Ht can be detected, for example, by detecting the change in the first electrical resistance R1, and processing the result based on the frequency of the AC component ia1 of the first current i1 (the frequency of the AC magnetic field component Ha1 of the first magnetic field Ha).

In the case where both the local minimum value and the maximum value are of the first polarity (e.g., positive), for example the first current i1 and the first magnetic field Ha are always of the first polarity (positive) and never become 0 or negative. This enables detection with suppressed noise.

For example, when the first current i1 (and the first magnetic field) changes from positive to 0 or negative, magnetic domain disturbance occurs in at least one of the first magnetic layer 11a and the first opposing magnetic layer 11b.

Disturbance of magnetic domains includes, for example, generation of magnetic domains, disappearance of magnetic domains, movement of magnetic domains, and the like. The disturbance of the magnetic domain causes noise in the signal from the first magnetic element 11. In the embodiment, when the first current i1 and the first magnetic field Ha are always of one polarity (for example, positive), noise caused by the disturbance of the magnetic domain can be suppressed. This enables more stable and highly sensitive detection. According to the embodiments, it is possible to provide a sensor and an inspection device with improved characteristics.

As shown in FIG. 2A, a length of the first conductive member 21 in the second direction D2 is defined as length Lc1. A length of the first conductive member 21 in the third direction D3 is defined as length Lc2. In the embodiments, length Lc1 is preferably longer than length Lc2. This makes the direction of the generated magnetic field (first magnetic field Ha) more stable. The ratio (Lc1/Lc2) of the length Lc1 to the length Lc2 is, for example, not less than 2 and not more than 1000.

In the first magnetic element 11, the ratio (Le1/Le2) of the length Le1 to the length Le2 is, for example, not less than 2 and not more than 1000.

Figure 5:
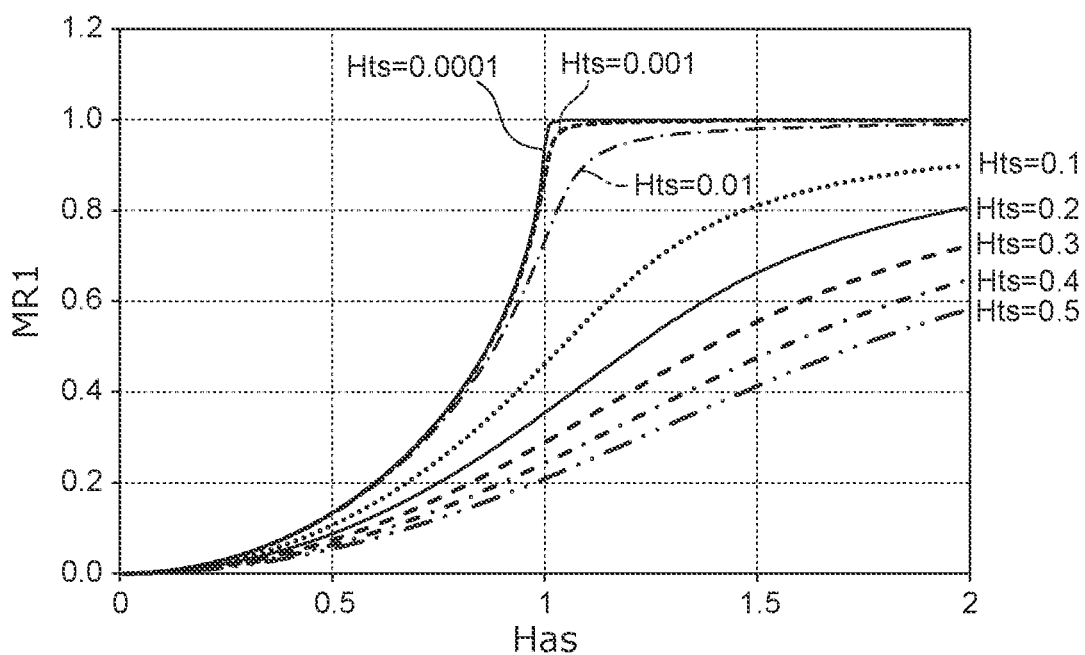
FIG. 5 is a graph illustrating characteristics of the sensor.
Figure 6:
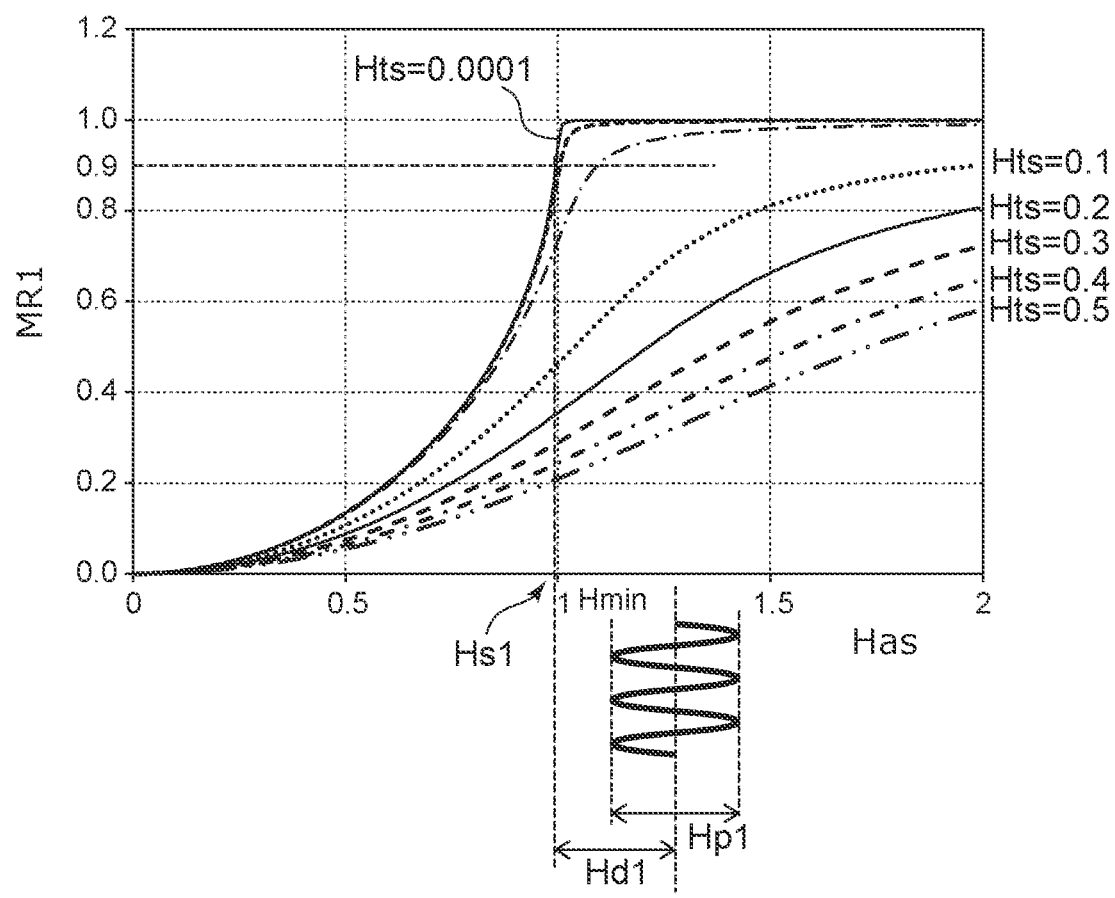
FIG. 6 is a graph illustrating characteristics of the sensor.

FIGS. 5 and 6 are graphs illustrating characteristics of the sensor.

FIG. 6 illustrates simulation results of the characteristics of the sensor 110 when the first magnetic portion 41 and the first opposing magnetic portion 41A are not provided. In the simulation, the first magnetic layer 11a is used as the magnetization free layer, and the first opposing magnetic layer 11b is used as the reference layer. The target magnetic field Ht along the second direction D2 and a magnetic field (first magnetic field Ha) along the third direction D3 are applied to the first magnetic element 11. In the simulations, these magnetic fields do not include a DC component. The orientation of the magnetization 11aM of the first magnetic layer 11a and the magnetization 11bM of the first opposing magnetic layer 11b are calculated for the cases when these magnetic fields are applied. The magnetoresistance is calculated based on the angle of the orientation of these magnetizations.

The horizontal axis of FIG. 5 is the magnetic field strength Has along the third direction D3. The magnetic field strength Has is normalized by the anisotropic magnetic field Hk of the magnetization free layer. The vertical axis in FIG. 5 is the magnetoresistance MR1. The magnetoresistance MR1 is normalized by the maximum value of magnetoresistance. FIG. shows values for various standardized target magnetic fields Hts. The normalized target magnetic field Hts is normalized by the anisotropic magnetic field Hk of the magnetization free layer.

In FIG. 5, the magnetic resistance MR1 when the normalized target magnetic field Hts is 0.0001 corresponds to the magnetic resistance when the target magnetic field Ht is not substantially applied to the first magnetic element 11. When the magnetic field strength Has increases, the magnetic resistance MR1 increases. The magnetoresistance MR1 is saturated when the magnetic field strength Has is 1 or more.

As shown in FIG. 5, as the normalized target magnetic field Hts increases, the change in the magnetoresistance MR1 becomes gently. For example, when the magnetic field strength Has is 1.5, the magnetoresistance MR1 changes greatly with the change of the normalized target magnetic field Hts. By using such a characteristic, the magnetic field Ht can be detected with high sensitivity by detecting the magnetic resistance.

In FIG. 6, some parameters are indicated as in as the case of FIG. 5. The saturation value of the magnetoresistance MR1 when the target magnetic field Ht is zero (Hts=0.0001 in FIG. 6) is defined as 1. In the case where the target magnetic field Ht is zero, the magnetic field strength (Has) at which the magnetic resistance MR1 is 0.9 is defined as the first magnetic field value Hs1. The first magnetic field value Hs1 is of a first polarity (positive in this example). The first magnetic field value Hs1 corresponds, for example, to the approximate saturation magnetic field. In the embodiment, the absolute value of the local minimum value Hmin (see FIG. 4B) of the first magnetic field Ha is preferably larger than the absolute value of the first magnetic field value Hs1.

That is, in the embodiments, for example, $$Hd1-Hp/2 > Hs1$$

is preferably satisfied. Under such conditions, the target magnetic field Ht can be efficiently detected with higher sensitivity.

For the case of the target magnetic field Ht is not applied to the first magnetic element 11, the first electrical resistance R1 of the first magnetic element 11 is 0.9 times of the saturated electrical resistance (the saturated value of the magnetic resistance MR1) when a magnetic field along the cross direction Dx (that is, the third direction D3) having the first magnetic field value Hs1 of the first polarity is applied to the first magnetic element 11. The saturated electrical resistance is the saturation value of the first electrical resistance R1 of the first magnetic element 11 when the magnetic field along the cross direction Dx (that is, the third direction D3) increases.

In the embodiment, the local minimum value of the first current i1 corresponds to the difference between the DC component id1 of the first current i1 and ½ of the amplitude ip1 of the AC component ia1. This difference (the absolute value of the local minimum value of the first current i1) is preferably greater than the absolute value of the first current value of the first polarity corresponding to the first magnetic field value Hs1. For example, in a state where the target magnetic field Ht is not applied to the first magnetic element 11, when a current having a first current value and a first polarity flows through the first conductive member 21, the first electrical resistance R1 of the magnetic element 11 is 0.9 times of the saturated electrical resistance. The saturated electrical resistance is the saturated value of the first electrical resistance R1 of the first magnetic element 11 when the current flowing through the first conductive member 21 increases. With such a first current i1, the target magnetic field Ht can be efficiently detected with higher sensitivity.

FIGS. 7 and 8A to 8C are schematic views illustrating a sensor according to the first embodiment.

Figure 8A:
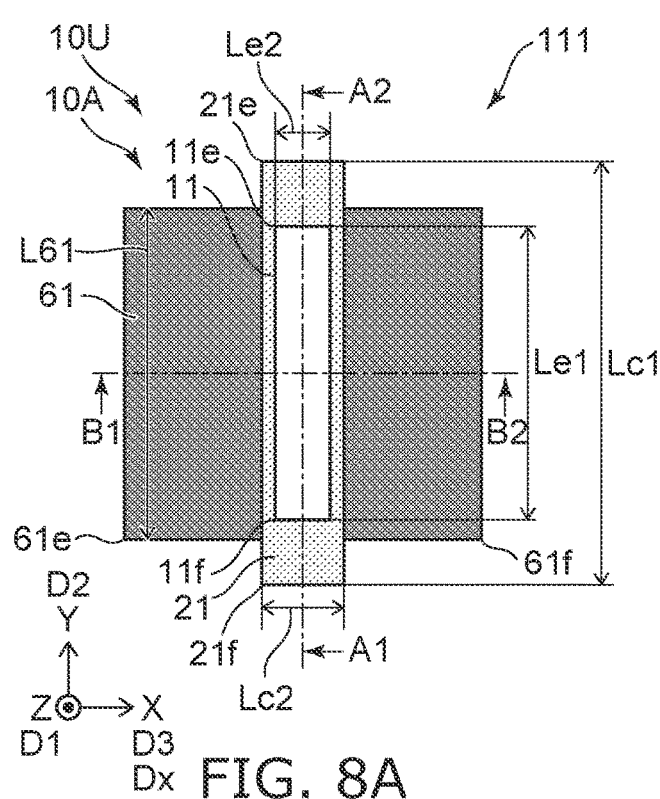
FIGS. 8A to 8C are schematic views illustrating the sensor according to the first embodiment.
Figure 8B:
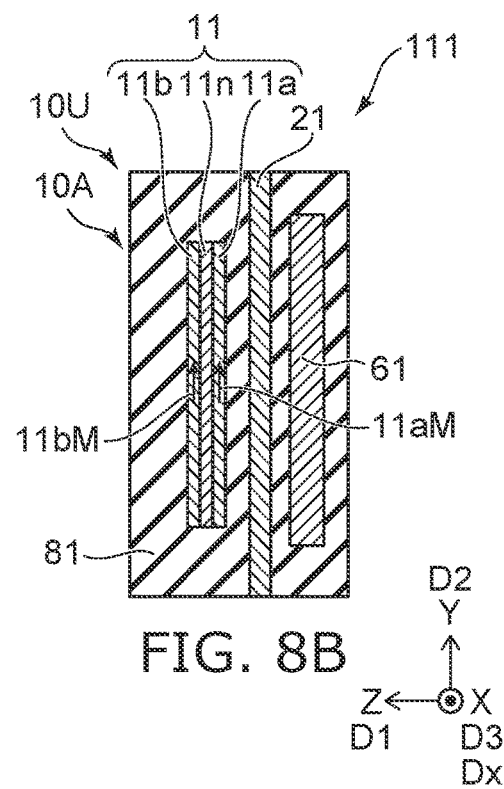
Figure 8C:
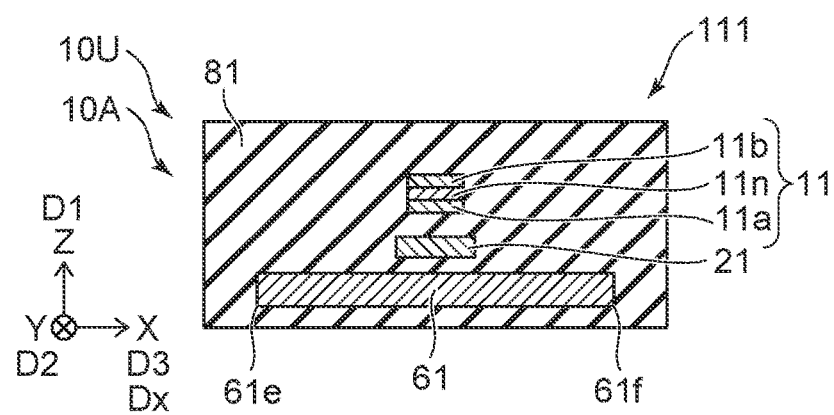

FIG. 8A is a plan view. FIG. 8B is a cross-sectional view taken along line the A1-A2 of FIG. 8A. FIG. 8C is a cross-sectional view along the line B1-B2 of FIG. 8A.

Figure 7:
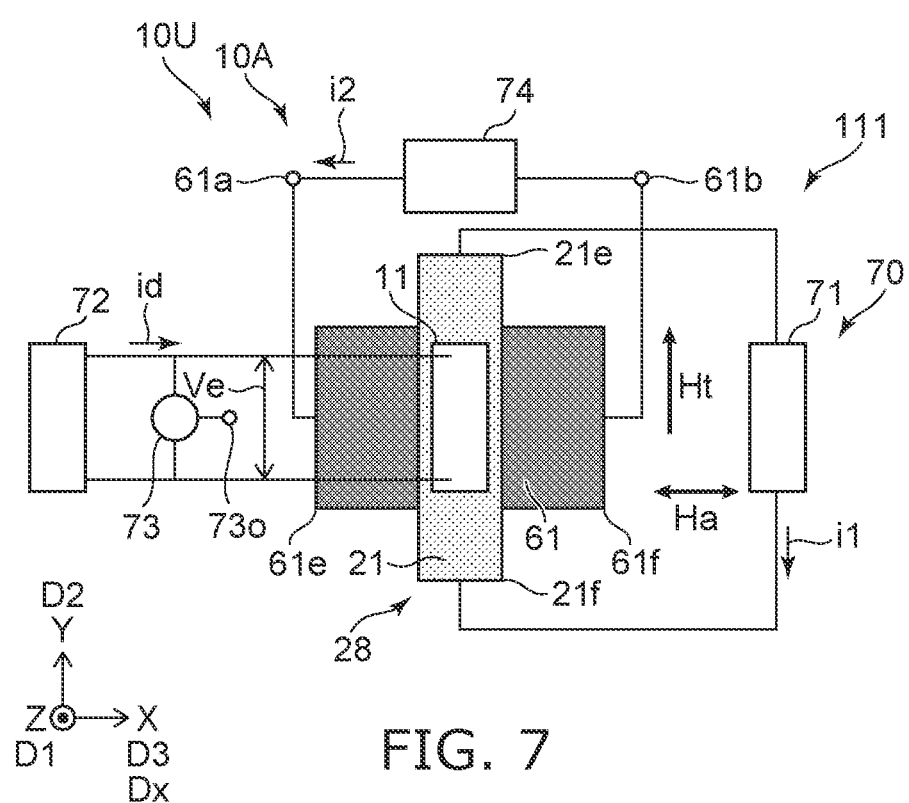
FIG. 7 is a schematic view illustrating a sensor according to the first embodiment.

As shown in FIG. 7, a sensor 111 according to the embodiment also includes the element portion 10U. The element portion 10U includes the first element 10A. In the sensor 111, the first element 10A includes the first magnetic element 11, the first conductive member 21 and the first conductive layer 61. In the sensor 111, the first magnetic portion 41 and the first opposing magnetic portion 41A may be omitted. Except for these, the configuration of the sensor 111 may be the same as that of the sensor 110.

As shown in FIGS. 8B and 8C, also in the sensor 111, the first magnetic element 11 includes the first magnetic layer 11a and the first opposing magnetic layer 11b. As shown in FIG. 8B, the length Le1 of the first magnetic element 11 along the second direction D2 is longer than the length Let of the first magnetic element 11 along the third direction D3. As already explained, the second direction D2 crosses the first direction D1, which is from the first magnetic layer 11a to the first opposing magnetic layer 11b. The third direction D3 crosses a plane including the first direction D1 and the second direction D2.

The first conductive member 21 includes the first conductive portion 21e and the first other conductive portion 21f. The direction from the first other conductive portion 21f to the first conductive portion 21e is along the second direction D2.

The first conductive layer 61 overlaps the first magnetic element 11 in the first direction D1. The stacking order of the first magnetic element 11, the first conductive layer 61 and the first conductive member 21 is arbitrary As shown in FIGS. 7 and 8A, the first conductive layer 61 includes a first conductive layer portion 61e and a first other conductive layer portion 61f. A direction from the first conductive layer portion 61e to the first other conductive layer portion 61f is along the third direction D3. As shown in FIG. 7, a second current i2 can flow between the first conductive layer portion 61e and the first other conductive layer portion 61f.

For example, as shown in FIG. 7, a fourth circuit 74 may be provided. A fourth circuit 74 may be included in the sensor 111. The fourth circuit 74 may be provided separately from the sensor 111. The fourth circuit 74 can supply the second current i2 to the first conductive layer 61. A first terminal 61a electrically connected to the first conductive layer portion 61e may be provided. A first other terminal 61b electrically connected to the first other conductive layer portion 61f may be provided. The fourth circuit 74 is electrically connected to the first terminal 61a and the first other terminal 61b. The fourth circuit 74 is, for example, a current source. The second current i2 may be, for example, a direct current.

By the second current i2 flowing through the first conductive layer 61, a magnetic field is generated from the first conductive layer 61. This magnetic field includes a component in the second direction D2. This magnetic field is applied to the first magnetic element 11. This magnetic field functions as a bias magnetic field. In the sensor 111, by using the magnetic field generated from the first conductive layer 61, the target magnetic field Ht can be detected in a region where the rate of change of the first electrical resistance R1 of the first magnetic element 11 is high. For example, high detection sensitivity can be obtained. According to the embodiment, it is possible to provide a sensor with improved characteristics.

In the sensor 111, as shown in FIG. 8A, it is preferable that the length L61 of the first conductive layer 61 along the second direction D2 is longer than the length Le1 of the first magnetic element 11 along the second direction D2. A magnetic field generated from the first conductive layer 61 is uniformly and effectively applied to the first magnetic element 11.

Also in the sensor 111, the first current i1 (and the first magnetic field Ha) described with respect to FIGS. 4A and 4B may be applied. For example, as shown in FIG. 7, the first circuit 71 is electrically connected to the first conductive portion 21e and the first other conductive portion 21f. first circuit 71 is configured to supply the first current i1 to the first conductive member 21. The first current i1 includes the AC component ia1. The local minimum value of the first current i1 has the first polarity. The local maximum value of the first current i1 has the first polarity. Also in this case, the first electrical resistance R1 of the first magnetic element 11 changes according to the change in the first current i1.

As shown in FIG. 7, in the sensor 111, the controller 70 may include the second circuit 72 and the third circuit 73. The second circuit 72 is configured to supply the detection current id to the first magnetic element 11. The third circuit 73 is configured to detect a value corresponding to the change in the first electrical resistance R1.

Figure 9A:
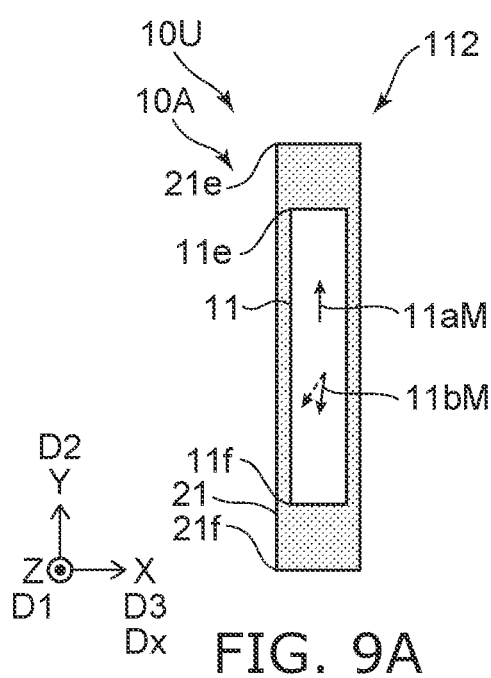
FIGS. 9A to 9C are schematic views illustrating a sensor according to the first embodiment.
Figure 9B:
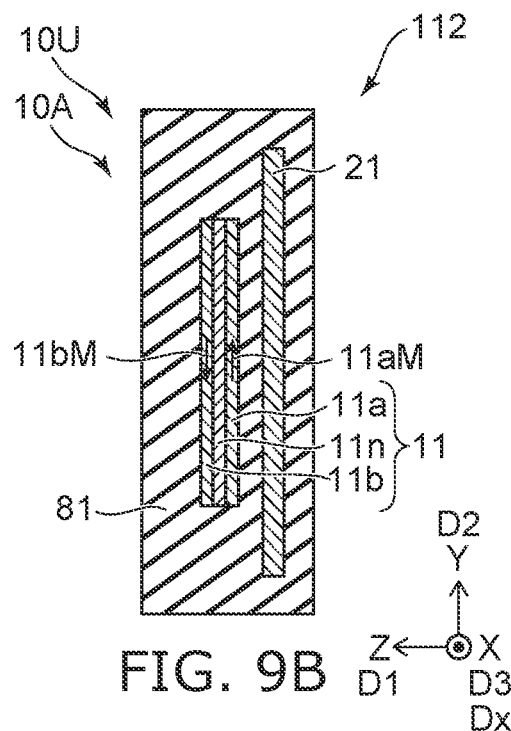
Figure 9C:
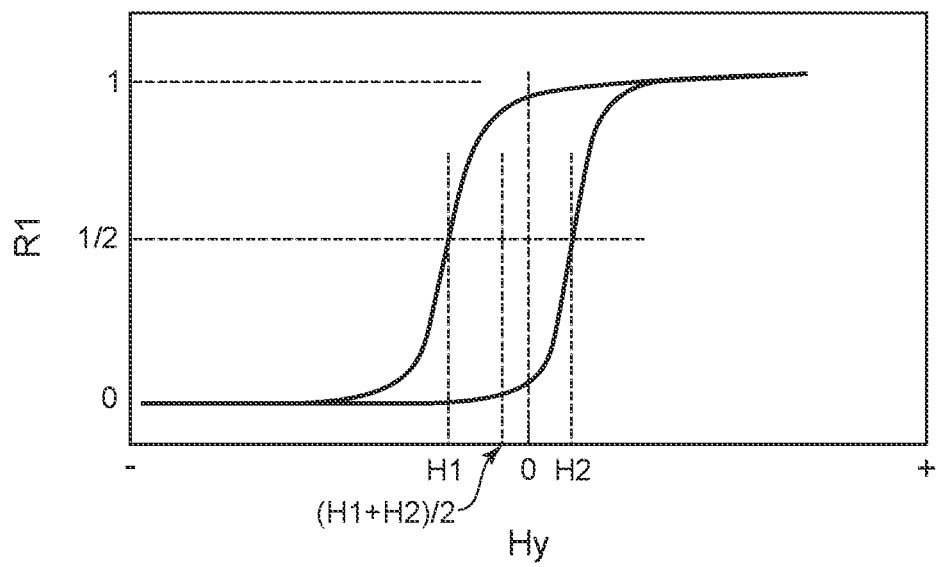

FIGS. 9A to 9C are schematic views illustrating a sensor according to the first embodiment.

FIG. 9A is a plan view illustrating the first magnetic element 11 and the first conductive member 21 in a sensor 112 according to the embodiment. FIG. 9B is a cross-sectional view. In the sensor 112, the first magnetic portion 41, the first opposing magnetic portion 41A and the first conductive layer 61 may be omitted.

In the sensor 112, a negative exchange coupling exerts between the first magnetic layer 11a and the first opposing magnetic layer 11b. For example, when the first non-magnetic layer 11n is a Cu layer, the thickness of the Cu layer is approximately 2 nm or less. The negative exchange coupling may be obtained by adjusting the conditions (such as thickness and magnetic properties) of the first magnetic layer 11a, the first opposing magnetic layer 11b, and the first non-magnetic layer 11n.

In the sensor 112, for example, the first magnetic layer 11a is the pinned layer. The first opposing magnetic layer 11b is the magnetization free layer. The magnetization 11aM of the first magnetic layer 11a is along the second direction D2. The magnetization 11bM of the first opposing magnetic layer 11b includes a component in the second direction D2. The magnetization 11bM includes a component opposite to the magnetization 11aM.

FIG. 9C illustrates the magnetic properties of the first magnetic element 11 in the sensor 112. The horizontal axis of FIG. 9C is the magnetic field Hy applied to the first magnetic element 11. The magnetic field Hy is along the second direction D2. The vertical axis is the first electrical resistance R1. The vertical axis may correspond to voltage Ve (see FIG. 1).

As shown in FIG. 9C, the magnetic characteristic (first electrical resistance R1) of the first magnetic element 11 shifts with respect to Hy=0. For example, the two magnetic fields Hy, where ½ of the first electrical resistance R1 are obtained, defined as the magnetic field H1 and the magnetic field H2. The magnetic field (H1+H2)/2 is negative. Such a shift is caused by the negative exchange coupling.

In the sensor 112, due to the shifted magnetic characteristics, the target magnetic field Ht can be detected in a region where the change rate of the first electrical resistance R1 of the first magnetic element 11 is high. For example, high detection sensitivity can be obtained. According to the embodiment, it is possible to provide a sensor whose characteristics can be improved.

In the sensor 112, the first circuit 71, the second circuit 72 and the third circuit 73 described with respect to the sensor 111 may be applied. Also in the sensor 112, the first current i1 (and the first magnetic field Ha) described with respect to FIGS. 4A and 4B may be applied. The first current i1 includes the AC component ia1. The local minimum value of the first current i1 has the first polarity. The local maximum value of the first current i1 has the first polarity.

FIGS. 10A to 10C are schematic views illustrating a sensor according to the first embodiment.

FIG. 10A is a plan view illustrating the first magnetic element 11 and the first conductive member 21 in a sensor 113 according to the embodiment. FIG. 10B is a cross-sectional view. In the sensor 113, the first magnetic portion 41, the first opposing magnetic portion 41A and the first conductive layer 61 may be omitted.

In the sensor 113, an exchange coupling exerts between the first magnetic layer 11a and the first opposing magnetic layer 11b. For example, when the first non-magnetic layer 11n is a Cu layer, the thickness of the Cu layer is approximately 2 nm or less. The exchange coupling may be obtained by adjusting the conditions (such as the thickness and magnetic properties) of the first magnetic layer 11a, the first opposing magnetic layer 11b, and the first non-magnetic layer 11n.

In the sensor 113, for example, the first magnetic layer 11a is the pinned layer. The first opposing magnetic layer 11b is the magnetization free layer. The magnetization 11aM of the first magnetic layer 11a is along the third direction D3. The magnetization 11bM of the first opposing magnetic layer 11b includes a component in the third direction D3. The magnetization 11bM includes a component in the same direction as the magnetization 11aM. With such a configuration, the magnetic properties of the first magnetic element 11 shift the first magnetic field Ha applied from the outside.

FIG. 10C illustrates the magnetic properties of the first magnetic element 11 in the sensor 112. The horizontal axis of FIG. 10C is the magnetic field Hx applied to the first magnetic element 11. The magnetic field Hx is along the third direction D3. The vertical axis is the first electrical resistance R1. The vertical axis may correspond to voltage Ve (see FIG. 1).

As shown in FIG. 10C, the magnetic characteristic (first electrical resistance R1) of the first magnetic element 11 shifts with respect to Hx=0. For example, the magnetic fields Hm, where ½ of the change in the first electrical resistance R1 is obtained, is not zero. The magnetic field Hm can be negative or positive. Such a shift is caused by the action of exchange coupling.

in the sensor 113, by the shifted magnetic properties, the first magnetic field Ha of the first polarity (e.g., positive) for both the local minimum value and the local maximum value shown in FIG. 4 can be obtained. Thereby, the target magnetic field Ht can be detected in the region where the change rate of the first electrical resistance R1 of the first magnetic element 11 is high. For example, high detection sensitivity can be obtained. According to the embodiment, it is possible to provide a sensor whose characteristics can be improved.

In the sensor 113, the first circuit 71, the second circuit 72 and the third circuit 73 described with respect to the sensor 111 may be applied. Also in the sensor 113, the first current i1 (and the first magnetic field Ha) described with respect to FIGS. 4A and 4B may be applied. The first current i1 includes the AC component ia1. The local minimum value and the local maximum value of the first current i1 may be of the first polarity. Since the above shift can be used in the sensor 113, the DC component id1 of the first current i1 can be modified in various ways. For example, the first current i1 may not include the DC component id1.

FIGS. 11 and 12A to 12C are schematic views illustrating a sensor according to the first embodiment.

FIG. 12A is a plan view. B is a cross-sectional view taken along the line A1-A2 of FIG. 12A. FIG. 12C is a cross-sectional view along the line B1-B2 of FIG. 12A.

Figure 11:
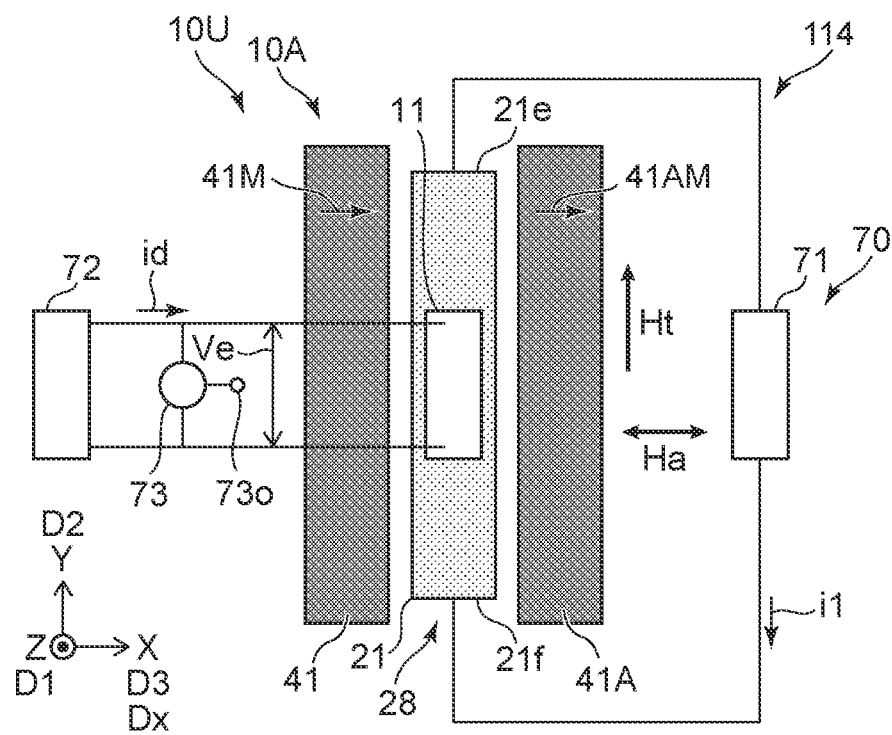
FIG. 11 is a schematic view illustrating a sensor according to the first embodiment.

As shown in FIG. 11, a sensor 114 according to the embodiment also includes the element portion 10U. The element portion 10U includes the first element 10A. In the sensor 114, the first element 10A includes the first magnetic element 11, the first conductive member 21 and the first magnetic portion 41. The position of the first magnetic portion 41 in the sensor 114 is different from the position in the sensor 110. The configuration of the sensor 114 excluding this may be the same as the configuration of the sensor 110.

As shown in FIG. 12B, also in the sensor 114, the first magnetic element 11 includes the first magnetic layer 11a and the first opposing magnetic layer 11b. The direction from the first magnetic layer 11a to the first opposing magnetic layer 11b is the first direction D1. As shown in FIG. 12A, the length Le1 of the first magnetic element 11 along the second direction D2 is longer than the length Let of the first magnetic element 11 along the third direction D3. The second direction D2 crosses the first direction D1. The third direction D3 crosses a plane including the first direction D1 and the second direction D2.

As shown in FIGS. 11 and 12A, the first conductive member 21 includes the first conductive portion 21e and the first other conductive portion 21f. The direction from the first other conductive portion 21f to the first conductive portion 21e is along the second direction D2.

As shown in FIG. 11, the direction from the first magnetic portion 41 to the first magnetic element 11 is along the third direction D3. In the sensor 114, a bias magnetic field is applied to the first magnetic element 11 from the first magnetic portion 41. As a result, the magnetic properties of the first magnetic element 11 shift with respect Hx=0. For example, the first magnetic field Ha having both the local minimum value and at the local maximum value being of the first polarity (for example, positive) as shown in FIG. 4 can be obtained. Thereby, for example, the target magnetic field Ht can be detected in the region where the change rate of the first electrical resistance R1 of the first magnetic element 11 is high. For example, high detection sensitivity can be obtained. According to the embodiment, it is possible to provide a sensor with improved characteristics.

As shown in FIG. 12A, the length L41 of the first magnetic portion 41 along the second direction D2 is preferably longer than the length Le1 of the first magnetic element 11 along the second direction D2. As a result, the bias magnetic field generated by the first magnetic portion 41 is uniformly and effectively applied to the first magnetic element 11. For example, the first magnetic portion 41 includes a ferromagnetic material.

As shown in FIG. 11, the first element 10A may further include the first opposing magnetic portion 41A. At least a part of the first magnetic element 11 is between the first magnetic portion 41 and the first opposing magnetic portion 41A in the third direction D3. The bias magnetic field is effectively applied to the first magnetic element 11 by the first magnetic portion 41 and the first opposing magnetic portion 41A. For example, the material of the first opposing magnetic portion 41A may be the same as the material of the first magnetic portion 41.

As shown in FIG. 11, the orientation of the magnetization 41M of the first magnetic portion 41 includes a component in the third direction D3. The orientation of the magnetization 41AM of the first opposing magnetic portion 41A includes a component in the third direction D3. The orientation of the magnetization 41M of the first magnetic portion 41 is the same as the orientation of the magnetization 41AM of the first opposing magnetic portion 41A.

As shown in FIG. 12C, for example, at least a part of the first magnetic layer 11a and the first opposing magnetic layer 11b may be provided between the first magnetic portion 41 and the first opposing magnetic portion 41A. The positional relationship between the first conductive member 21 and the first magnetic portion 41 is arbitrary. The positional relationship between the first conductive member 21 and the first opposing magnetic portion 41A is arbitrary.

In the sensor 114, the bias magnetic field is applied to the first magnetic element 11 by the first magnetic portion 41 (and the first opposing magnetic portion 41A). This bias magnetic field includes a component in the third direction D3. Such a bias magnetic field functions, for example, as the DC component id1 included in the first current i1. In the sensor 114, the first current i1 may not include the DC component id1.

As shown in FIG. 11, in the sensor 114, the controller 70 may include the first circuit 71. The first circuit 71 is electrically connected to the first conductive portion 21e and the first other conductive portion 21f. The first circuit 71 is configured to supply the first current i1 to the first conductive member 21. The first current i1 includes the AC component ia1. The first current i1 may not substantially include the DC component id1. The configuration of the first circuit 71 is simplified.

Also in the sensor 114, the first electrical resistance R1 of the first magnetic element 11 changes according to the change in the first current i1. The controller 70 may include the second circuit 72 and the third circuit 73. The second circuit 72 is configured to supply the detection current id to the first magnetic element 11. The third circuit 73 is configured to detect the value corresponding to the change in the first electrical resistance R1.

Several examples of the sensors according to embodiments are described below.

FIG. 13 is a schematic view illustrating a sensor according to the first embodiment.

In FIG. 13, the first magnetic element 11 is illustrated shifted from the first conductive member 21 in the X-axis direction for easy understanding. The first magnetic element 11 may overlap the first conductive member 21 in the Z-axis direction.

As shown in FIG. 13, in a sensor 121 according to the embodiment, the element portion 10U includes the first element and a first resistor 31. The first resistor 31 includes a first resistor portion 31e and a first other resistor portion 31f. In this example, the first element portion 11e is electrically connected to the second circuit 72. The first other element portion 11f is electrically connected to the first resistor portion 31e. The first other resistor portion 31f is electrically connected to the second circuit 72. The third circuit 73 detects a change in potential at the connection point of the first other element portion 11f and the first resistor portion 31e.

FIGS. 14 and 15A to 15C are schematic views illustrating a sensor according to the first embodiment.

Figure 14:
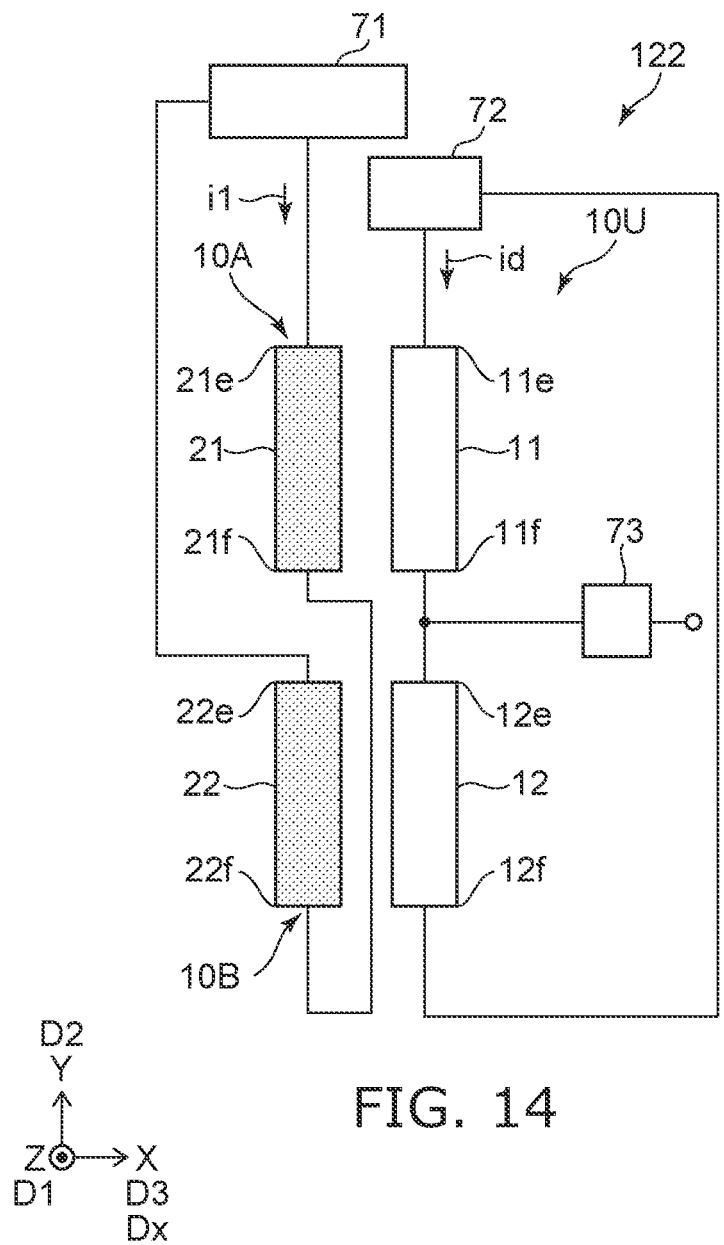
FIG. 14 is a schematic view illustrating a sensor according to the first embodiment.

As shown in FIG. 14, in a sensor 122 according to the embodiment, the element portion 10U further includes a second element 10B. The second element 10B includes a second magnetic element 12 and a second conductive member 22.

In FIG. 14, the first magnetic element 11 is drawn shifted from the first conductive member 21 in the X-axis direction for clarity of illustration. The first magnetic element 11 may overlap the first conductive member 21 in the Z-axis direction. In FIG. 14, the second magnetic element 12 is shown shifted from the second conductive member 22 in the X-axis direction for clarity. The second magnetic element 12 may overlap the second conductive member 22 in the Z-axis direction.

Figure 15A:
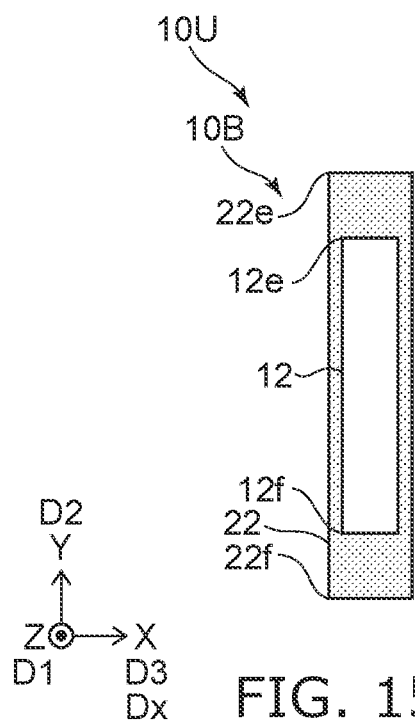
FIGS. 15A to 15C are schematic views illustrating a sensor according to the first embodiment.
Figure 15B:
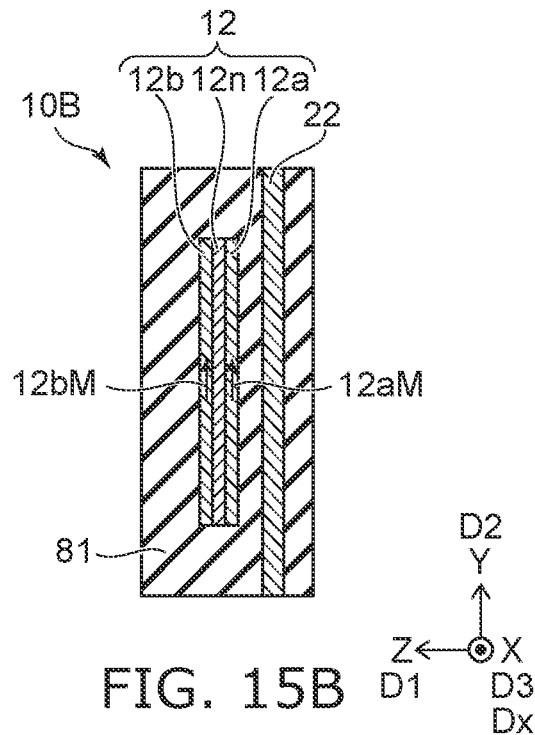
Figure 15C:
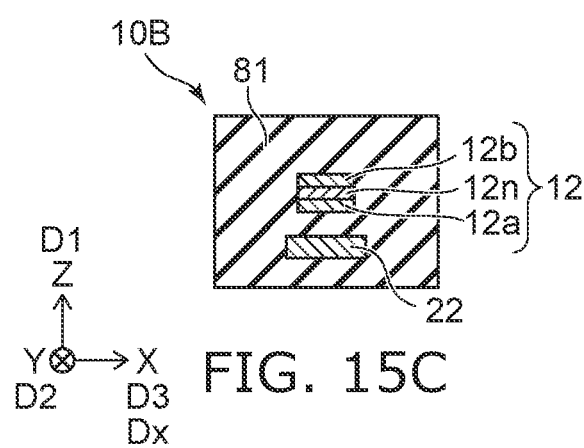

As shown in FIGS. 15B and 15C, the second magnetic element 12 includes a second magnetic layer 12a and a second opposing magnetic layer 12b. In this example, the second magnetic element 12 includes a second non-magnetic layer 12n. The second non-magnetic layer 12n is provided between the second magnetic layer 12a and the second opposing magnetic layer 12b.

In the second magnetic element 12, the second magnetic layer 12a may be, for example, one of the reference layer and the magnetization free layer. The second opposing magnetic layer 12b may be, for example, the other of the reference layer and the magnetization free layer. The change in electrical resistance of the second magnetic element 12 is, for example, based on a change of an angle between the magnetization 12aM of the second magnetic layer 12a and the magnetization 12bM of the second opposing magnetic layer 12b depending on the magnetic field applied to the second magnetic element 12.

As shown in FIG. 14, the second conductive member 22 includes a second conductive portion 22e and a second other conductive portion 22f. A direction from the second conductive portion 22e to the second other conductive portion 22f is along the second direction D2.

As shown in FIG. 14, the first conductive portion 21e is electrically connected to the first circuit 71 in this example. The first other conductive portion 21f is electrically connected to the second other conductive portion 22f. The second conductive portion 22e is electrically connected to the first circuit 71. The first circuit 71 is configured to supply the first current i1 to the first conductive member 21 and the second conductive member 22. The first magnetic element 11 includes the first element portion 11e and the first other element portion 11f. The first element portion 11e corresponds to the first conductive portion 21e. The first other element portion 11f corresponds to the first other conductive portion 21f. An orientation from the first element portion 11e to the first other element portion 11f is a first orientation.

The second magnetic element 12 includes a second element portion 12e and a second other element portion 12f. The second element portion 12e corresponds to the second conductive portion 22e. The second other element portion 12f corresponds to the second other conductive portion 22f. An orientation from the second element portion 12e to the second other element portion 12f is a second orientation.

The detection current id supplied from the second circuit 72 flows through the first magnetic element 11 in the first orientation and through the second magnetic element 12 in the second orientation. When the first current i1 supplied from the first circuit 71 is flowing through the first conductive member 21 in the first orientation, the first current i1 flows through the second conductive member 22 in the opposite orientation of the second orientation.

Figure 16:
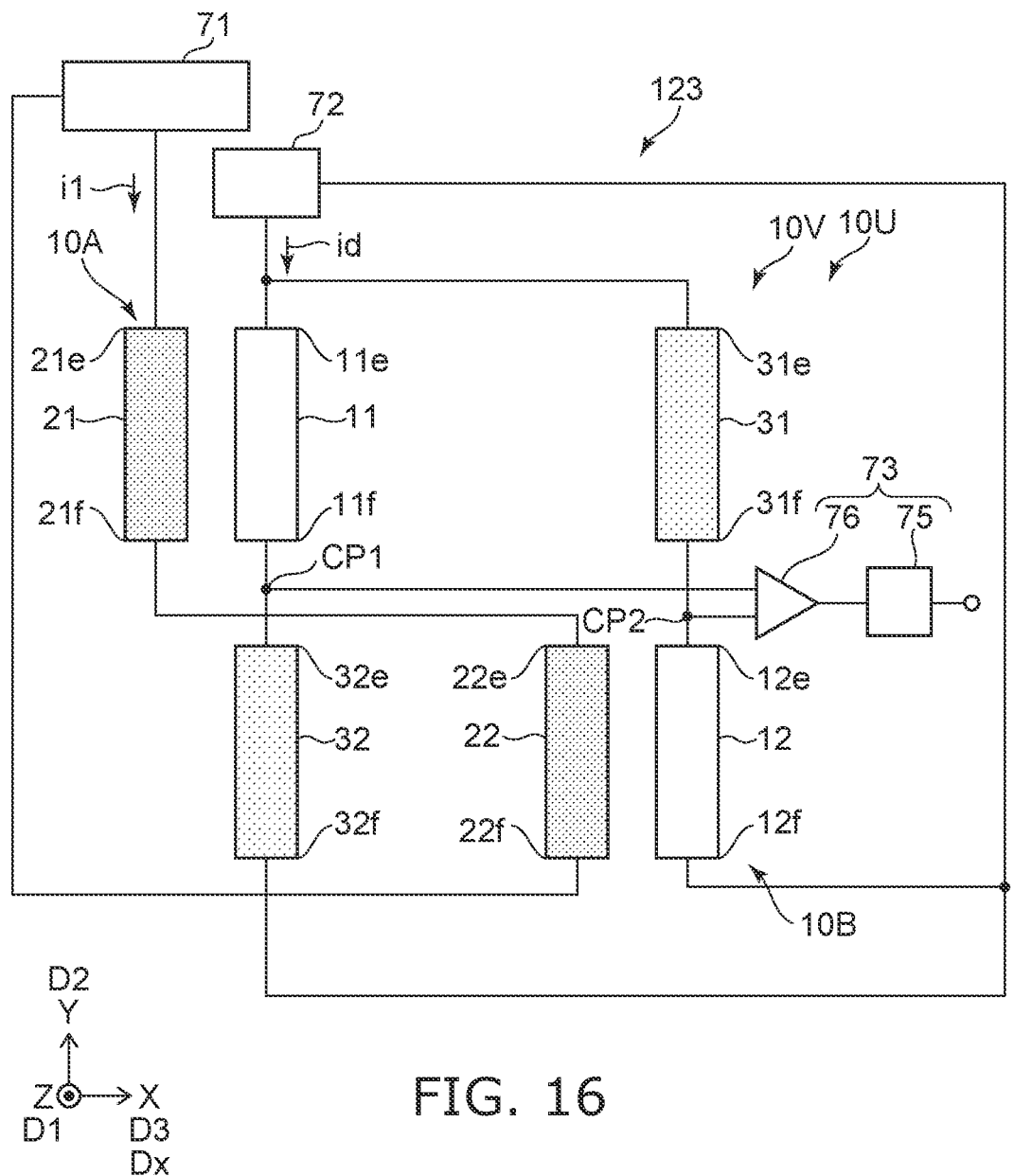
FIG. 16 is a schematic view illustrating a sensor according to the first embodiment.

FIG. 16 is a schematic view illustrating a sensor according to the first embodiment.

As shown in FIG. 16, in a sensor 123 according to the embodiment, the element portion 10U includes the first element 10A, the second element 10B, the first resistor 31 and a second resistor 32. The first element 10A includes the first magnetic element 11 and the first conductive member 21. The second element 10B includes a second magnetic element 12 and a second conductive member 22. In FIG. 16, the first magnetic element 11 is drawn shifted from the first conductive member 21 in the X-axis direction for clarity of illustration. In FIG. 16, the second magnetic element 12 is shown shifted from the second conductive member 22 in the X-axis direction for clarity.

The first magnetic element 11 includes the first element portion 11e and the first other element portion 11f. The first element portion 11e corresponds to the first conductive portion 21e. The first other element portion 11f corresponds to the first other conductive portion 21f. The direction from the first element portion 11e to the first other element portion 11f is the first direction.

The second element 10B includes the second magnetic element 12 and the second conductive member 22. The second conductive member 22 includes the second conductive portion 22e and the second other conductive portion 22f. The direction from the second conductive portion 22e to the second other conductive portion 22f is along the second direction D2.

The first resistor 31 includes the first resistor portion 31e and the first other resistor portion 31f. The direction from the first resistor portion 31e to the first other resistor portion 31f is along the second direction D2. The second resistor 32 includes a second resistor portion 32e and a second other resistor portion 32f. A direction from the second resistor portion 32e to the second other resistor portion 32f is along the second direction D2.

The second magnetic element 12 includes the second element portion 12e and the second other element portion 12f. The second element portion 12e corresponds to the second conductive portion 22e. The second other element portion 12f corresponds to the second other conductive portion 22f. The direction from the second element portion 12e to the second other element portion 12f is the second direction.

The first element portion 11e is electrically connected to the second circuit 72. The first other element portion 11f is electrically connected to the second resistor portion 32e. The second other resistor portion 32f is electrically connected to the second circuit 72.

The first resistor portion 31e is electrically connected to the second circuit 72. The first other resistor portion 31f is electrically connected to the second element portion 12e. The second other element portion 12f is electrically connected to the second circuit 72.

The detection current id flows through the first magnetic element 11 in the first orientation and through the second magnetic element 12 in the second orientation.

As shown in FIG. 16, the first conductive portion 21e is electrically connected to the first circuit 71 in this example. The first other conductive portion 21f is electrically connected to the second conductive portion 22e. The second other conductive portion 22f is electrically connected to the first circuit 71. The first circuit 71 is configured to supply the first current i1 to the first conductive member 21 and the second conductive member 22.

When the first current i1 is flowing through the first conductive member 21 in the first orientation, the first current i1 flows through the second conductive member 22 in the second orientation.

The third circuit 73 is configured to detect the potential difference between the first connection point CP1 and the second connection point CP2. The first connection point CP1 is a connection point between the first other element portion 11f and the second resistor portion 32e. The second connection point CP2 is a connection point between the first other resistor portion 31f and the second element portion 12e.

The third circuit 73 may include a differential amplifier 76 and processing circuit 75. The differential amplifier 76 detects the potential difference between the first connection point CP1 and the second connection point CP2. The processing circuit 75 processes the output signal obtained from the differential amplifier 76. The processing circuit 75 may include, for example, at least one of a lock-in amplifier, a band-pass filter circuit, or an FFT (Fast Fourier Transform) circuit. The processing circuit 75 extracts a first frequency component of the output signal from the differential amplifier 76, for example. The first frequency is, for example, the frequency of the AC component ia1 of the first current i1. The first frequency is, for example, the frequency of the alternating magnetic field component Ha1 of the first magnetic field Ha. The first frequency may include, for example, harmonic components of the AC component ia1 of the first current i1. The first frequency may include, for example, harmonic components of the alternating magnetic field component Ha1 of the first magnetic field Ha.

Thus, the element portion 10U may include a bridge circuit (see FIG. 16) including the first element 10A. The second circuit 72 is configured to supply the detection current id to the bridge circuit 10V. The third circuit 73 is configured to detect a value corresponds to the difference between the potential of the first midpoint (e.g., first connection point CP1) of the bridge circuit 10V and the potential of the second midpoint (e.g., second connection point CP2) of the bridge circuit 10V.

Figure 17:
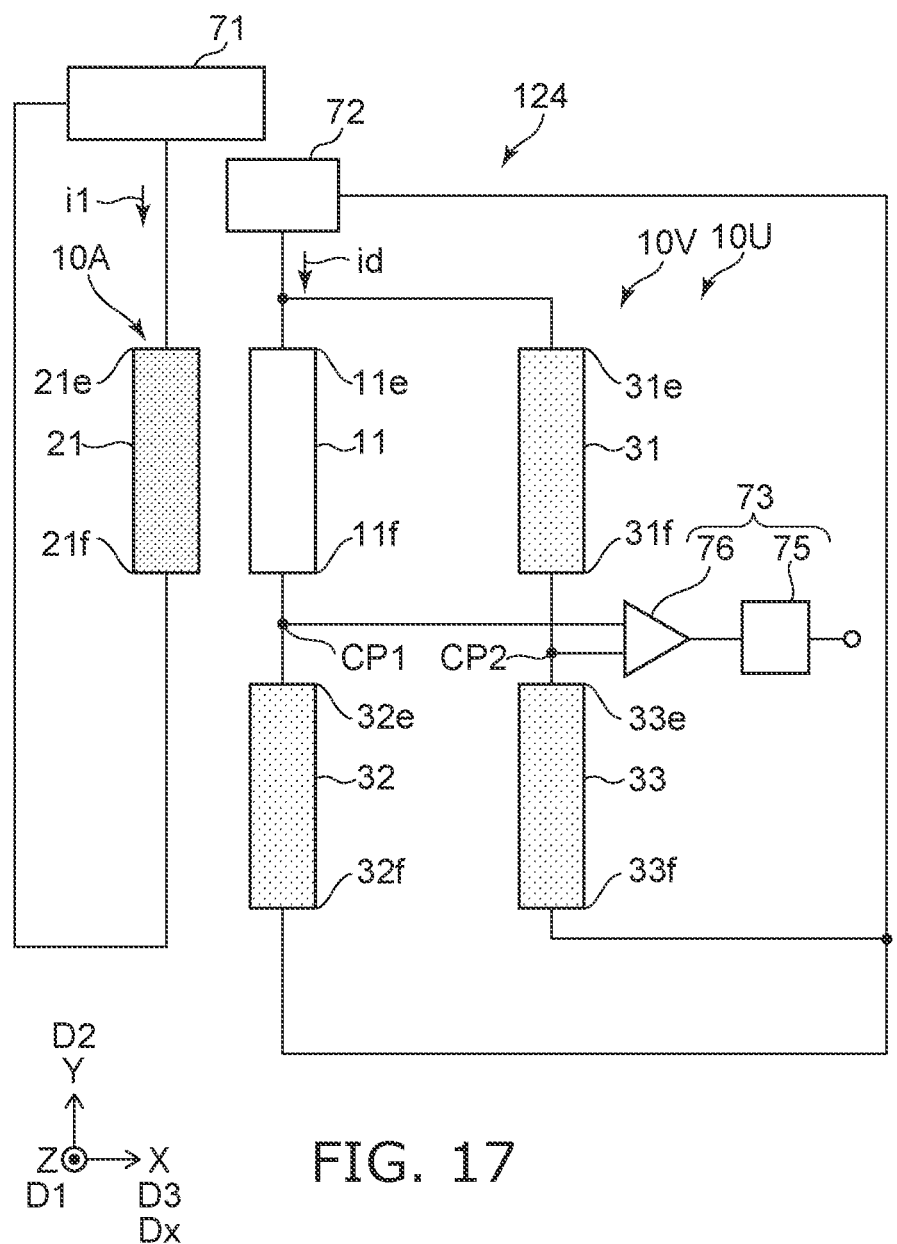
FIG. 17 is a schematic view illustrating a sensor according to the first embodiment.

FIG. 17 is a schematic view illustrating a sensor according to the first embodiment.

As shown in FIG. 17, in a sensor 124 according to the embodiment, the element portion 10U includes the first element 10A, the first resistor 31, the second resistor 32 and a third resistor 33. The third resistor 33 includes a third resistor portion 33e and a third other resistor portion 33f. A direction from the third resistor portion 33e to the third other resistor portion 33f is along the second direction D2.

In this example, the first element portion 11e is electrically connected to the second circuit 72. The first other element portion 11f is electrically connected to the second resistor portion 32e. The second other resistor portion 32f is electrically connected to the second circuit 72. The first resistor portion 31e is electrically connected to the second circuit 72. The first other resistor portion 31f is electrically connected to the third resistor portion 33e. The third other resistor portion 33f is electrically connected to the second circuit 72. The first connection point CP1 is a connection point between the first other element portion 11f and the second resistor portion 32e. The second connection point CP2 is a connection point between the first other resistor portion 31f and the third resistor portion 33e.

FIGS. 18, 19A to 19C, and 20A to 20C are schematic views illustrating a sensor according to the first embodiment.

Figure 18:
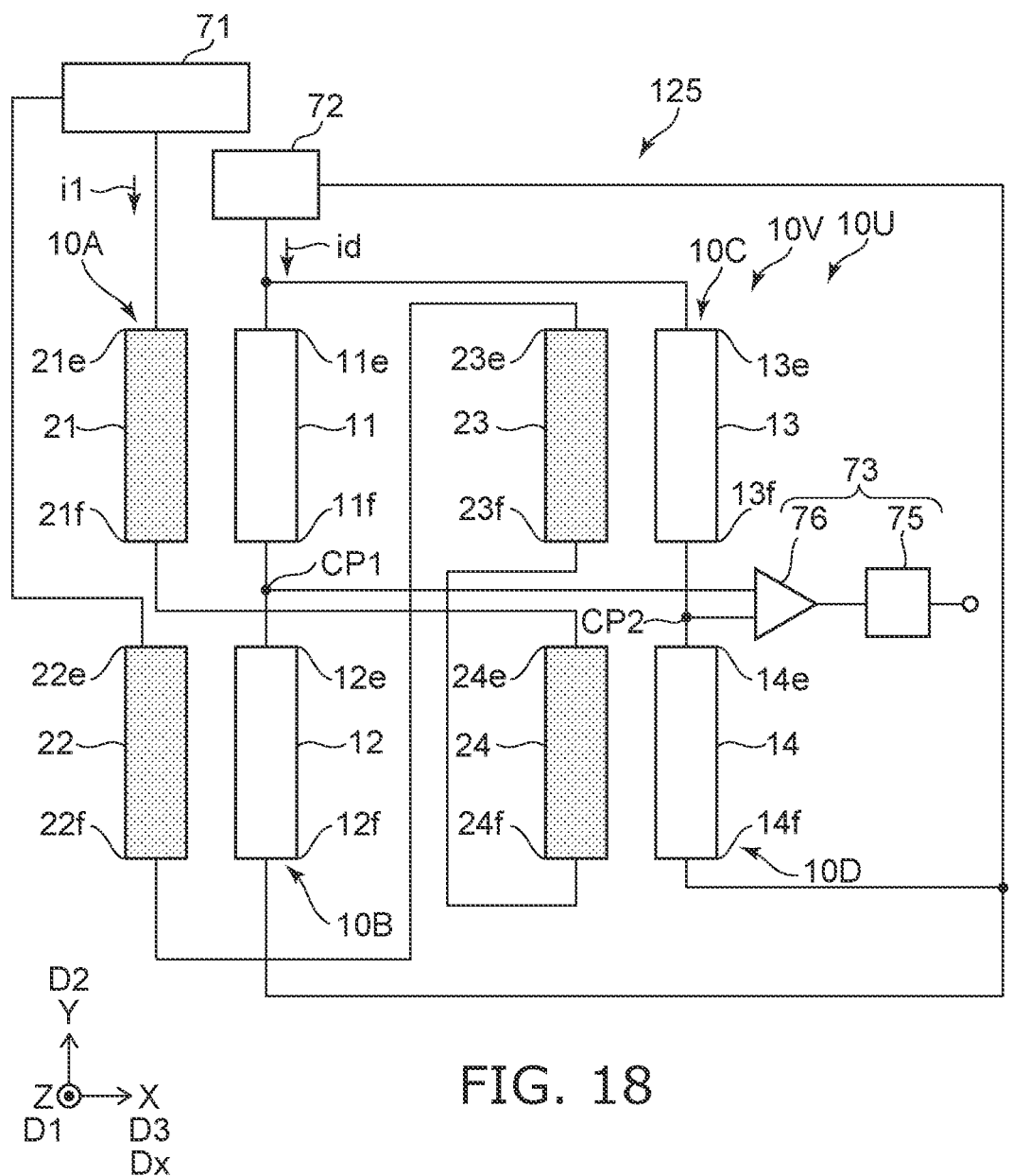
FIG. 18 is a schematic view illustrating a sensor according to the first embodiment.

As shown in FIG. 18, in a sensor 125 according to the embodiment, the element portion 10U includes the first element 10A, the second element 10B, a third element 10C and a fourth element 10D. The first element 10A includes the first magnetic element 11 and the first conductive member 21. The second element 10B includes the second magnetic element 12 and the second conductive member 22. The third element 10C includes a third magnetic element 13 and a third conductive member 23. The fourth element 10D includes a fourth magnetic element 14 and a fourth conductive member 24.

Figure 19A:
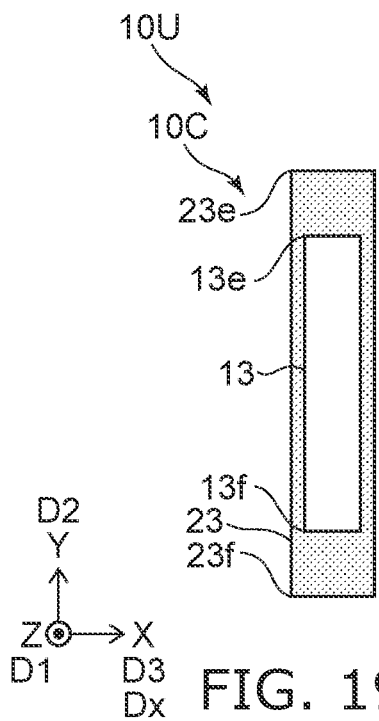
FIGS. 19A to 19C are schematic views illustrating a sensor according to the first embodiment.
Figure 19B:
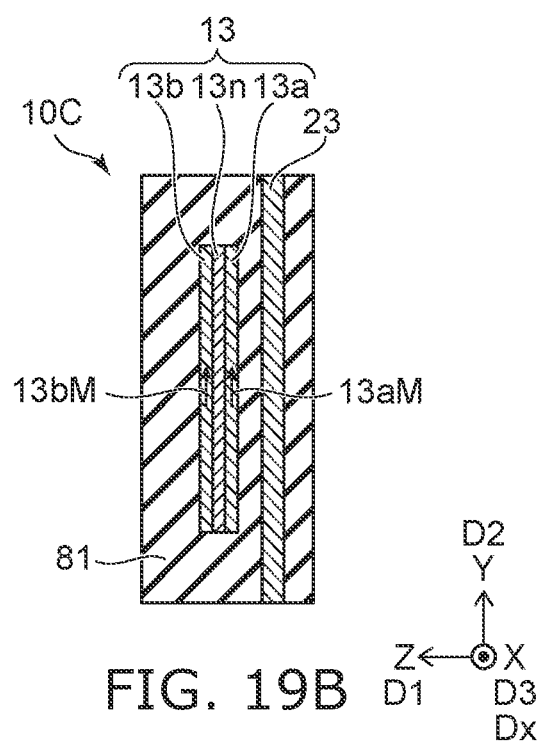
Figure 19C:
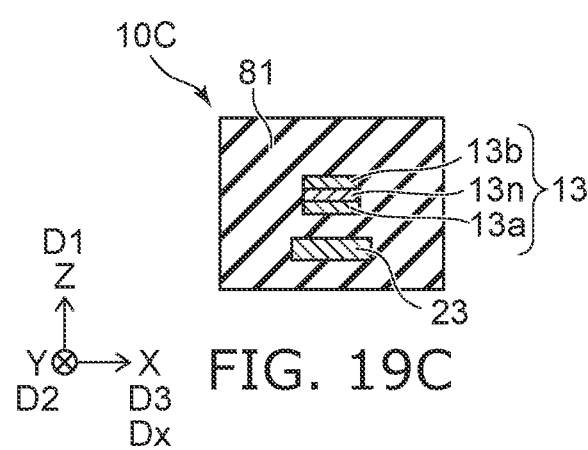

As shown in FIGS. 19B and 19C, the third magnetic element 13 includes a third magnetic layer 13a and a third opposing magnetic layer 13b. In this example, the third magnetic element 13 includes a third non-magnetic layer 13n. The third non-magnetic layer 13n is provided between the third magnetic layer 13a and the third opposing magnetic layer 13b.

In the third magnetic element 13, the third magnetic layer 13a may be, for example, one of the reference layer and the magnetization free layer. The third opposing magnetic layer 13b may be, for example, the other of the reference layer and the magnetization free layer. A change in electrical resistance of the third magnetic element 13 is, for example, based on a change of an angle between the magnetization 13aM of the third magnetic layer 13a and the magnetization 13bM of the third opposing magnetic layer 13b depending on the magnetic field applied to the third magnetic element 13.

As shown in FIGS. 20B and 20C, the fourth magnetic element 14 includes a fourth magnetic layer 14a and a fourth opposing magnetic layer 14b. In this example, the fourth magnetic element 14 includes a fourth non-magnetic layer 14n. The fourth non-magnetic layer 14n is provided between the fourth magnetic layer 14a and the fourth opposing magnetic layer 14b.

In the fourth magnetic element 14, the fourth magnetic layer 14a may be, for example, one of the reference layer and the magnetization free layer. The fourth opposing magnetic layer 14b may be, for example, the other of the reference layer and the magnetization free layer. A change in the electrical resistance of the fourth magnetic element 14 is, for example, based on a change of an angle between the magnetization 14aM of the fourth magnetic layer 14a and the magnetization 14bM of the fourth opposing magnetic layer 14b depending on the magnetic field applied to the fourth magnetic element 14.

As shown in FIG. 19A, the third conductive member 23 includes a third conductive portion 23e and a third other conductive portion 23f. A direction from the third conductive portion 23e to the third other conductive portion 23f is along the second direction D2.

As shown in FIG. 20A, the fourth conductive member 24 includes a fourth conductive portion 24e and a fourth other conductive portion 24f. A direction from the fourth conductive portion 24e to the fourth other conductive portion 24f is along the second direction D2.

As shown in FIG. 18, the first magnetic element 11 includes the first element portion 11e and the first other element portion 11f. The first element portion 11e corresponds to the first conductive portion 21e. The first other element portion 11f corresponds to the first other conductive portion 21f. The orientation from the first element portion 11e to the first other element portion 11f is the first orientation.

As shown in FIG. 18, the second magnetic element 12 includes the second element portion 12e and the second other element portion 12f. The second element portion 12e corresponds to the second conductive portion 22e. The second other element portion 12f corresponds to the second other conductive portion 22f. The orientation from the second element portion 12e to the second other element portion 12f is the second orientation.

As shown in FIG. 18, the third magnetic element 13 includes a third element portion 13e and a third other element portion 13f. The third element portion 13e corresponds to the third conductive portion 23e. The third other element portion 13f corresponds to the third other conductive portion 23f. An orientation from the third element portion 13e to the third other element portion 13f is a third orientation.

As shown in FIG. 18, the fourth magnetic element 14 includes a fourth element portion 14e and a fourth other element portion 14f. The fourth element portion 14e corresponds to the fourth conductive portion 24e. The fourth other element portion 14f corresponds to the fourth other conductive portion 24f. An orientation from the fourth element portion 14e to the fourth other element portion 14f is a fourth orientation.

The first element portion 11e is electrically connected to the second circuit 72. The first other element portion 11f is electrically connected to the second element portion 12e. The second other element portion 12f is electrically connected to the second circuit 72.

The third element portion 13e is electrically connected to the second circuit 72. The third other element portion 13f is electrically connected to the fourth element portion 14e. The fourth other element portion 14f is electrically connected to the second circuit 72.

The detection current id flows through the first magnetic element 11 in the first orientation, through the second magnetic element 12 in the second orientation, through the third magnetic element 13 in the third orientation, and through the fourth magnetic element 14 in the fourth orientation.

In this example, the first conductive portion 21e is electrically connected to the first circuit 71. The first other conductive portion 21f is electrically connected to the fourth conductive portion 24e. The fourth other conductive portion 24f is electrically connected to the third other conductive portion 23f. The third conductive portion 23e is electrically connected to the second other conductive portion 22f. The second conductive portion 22e is electrically connected to the first circuit 71.

When the first current i1 supplied from the first circuit 71 flows through the first conductive member 21 in the first orientation, the first current i1 flows through the second conductive member 22 in the opposite orientation to the second orientation, the first current i1 flows through the third conductive member 23 in the opposite orientation to the third orientation, and the first current i1 flows through the fourth conductive member 24 in the fourth orientation.

The first connection point CP1 is a connection point between the first other element portion 11f and the second element portion 12e. The second connection point CP2 is a connection point between the third other element portion 13f and the fourth element portion 14e.

Figure 21:
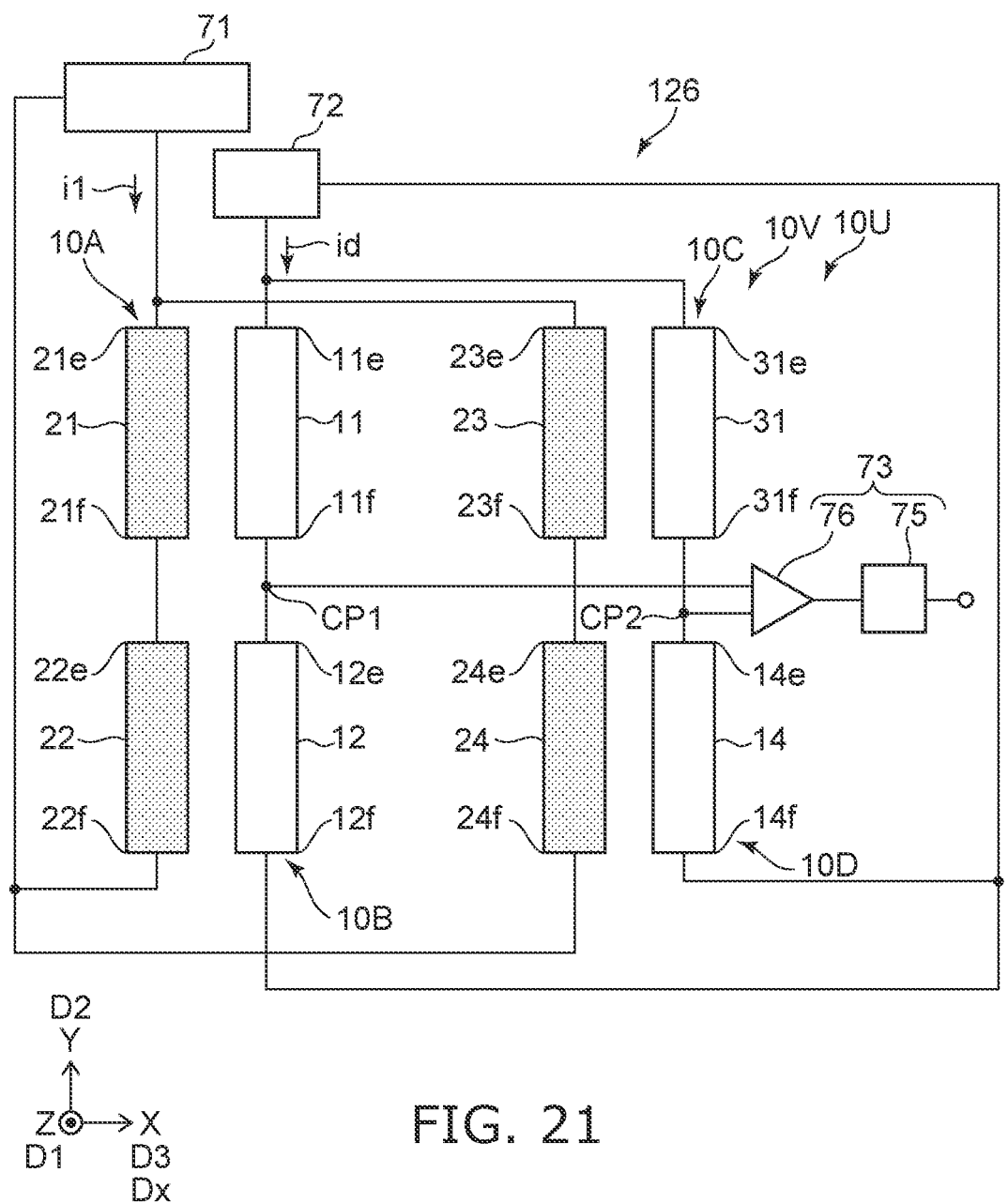
FIG. 21 is a schematic view illustrating a sensor according to the first embodiment.

FIG. 21 is a schematic view illustrating a sensor according to the first embodiment.

As shown in FIG. 21, in a sensor 126 according to the embodiment, the element portion 10U includes the first element the second element 10B, the third element 10C and the fourth element 10D. In the sensor 126, the connection relationship of the multiple conductive members is different from the connection relationship of the multiple conductive members in the sensor 125. In the sensor 116, the connection relationship between the multiple magnetic elements may be the same as the connection relationship between the multiple magnetic elements in the sensor 125.

In the sensor 126, the first conductive portion 21e and third conductive portion 23e are electrically connected to first circuit 71. The first other conductive portion 21f is electrically connected to the second conductive portion 22e. The third other conductive portion 23f is electrically connected to the fourth conductive portion 24e. The second other conductive portion 22f and the fourth other conductive portion 24f are electrically connected to the first circuit 71.

In the sensor 126, the orientation of the magnetization of the reference layer in the first magnetic element 11 is the same as the orientation of the magnetization of the reference layer in the fourth magnetic element 14. The orientation of the magnetization of the reference layer in the second magnetic element 12 is the same as the orientation of the magnetization of the reference layer in the third magnetic element 13. The orientation of magnetization of the reference layer in the first magnetic element 11 and the orientation of magnetization of the reference layer of the fourth magnetic element 14 are opposite to the orientation of magnetization of the reference layer in the second magnetic element 12 and the orientation of magnetization of the reference layer in the third magnetic element 13. In the configuration of the sensor 116 as well, it is possible to provide a sensor in which the influence of noise is suppressed and whose characteristics can be improved.

The configurations of the sensors 110 to 114 may be applied to the sensors 121 to 126 described above. For example, the sensors 121 to 126 may be provided with the first magnetic portion 41 (and the first opposing magnetic portion 41A) described with respect to the sensor 110. For example, each of the second element 10B, the third element 10C, and the fourth element 10D may include magnetic members similar to the first magnetic portion 41 (and the first opposing magnetic portion 41A) described with respect to the sensor 110.

For example, the sensors 121 to 126 may be provided with the first conductive layer 61 described with respect to sensor 111. For example, in the sensors 121-126, the properties of first magnetic element 11 described with respect to sensor 112 may be applied. For example, in the sensors 121 to 126, the properties of first magnetic element 11 described with respect to sensor 113 may be applied. For example, the sensors 121 to 126 may be provided with the first magnetic portion 41 (and the first opposing magnetic portion 41A) described with respect to the sensor 114.

Each of the second element 10B, the third element 10C, and the fourth element 10D may include the same magnetic member as the first magnetic portion 41 (and the first opposing magnetic portion 41A) described with respect to the sensor 114.

Each of the second element 10B, the third element 10C and the fourth element 10D may have the configuration of the first element 10A in the sensors 110 to 114.

For example, in each of the sensors 110 to 114, the element portion 10U may include the bridge circuit 10V including the first element 10A. The second circuit 72 is configured to supply the detection current id to the bridge circuit 10V. The third circuit 73 is configured to detected a value corresponds to the difference between the potential of the first midpoint (e.g., first connection point CP1) of the bridge circuit 10V and the potential of the second midpoint (e.g., second connection point CP2) of the bridge circuit 10y.

When the element portion 10U includes the bridge circuit 10V, the fourth circuit 74 may be provided commonly to the first element 10A, the second element 10B, the third element 10C, and the fourth element 10D.

Figure 22:
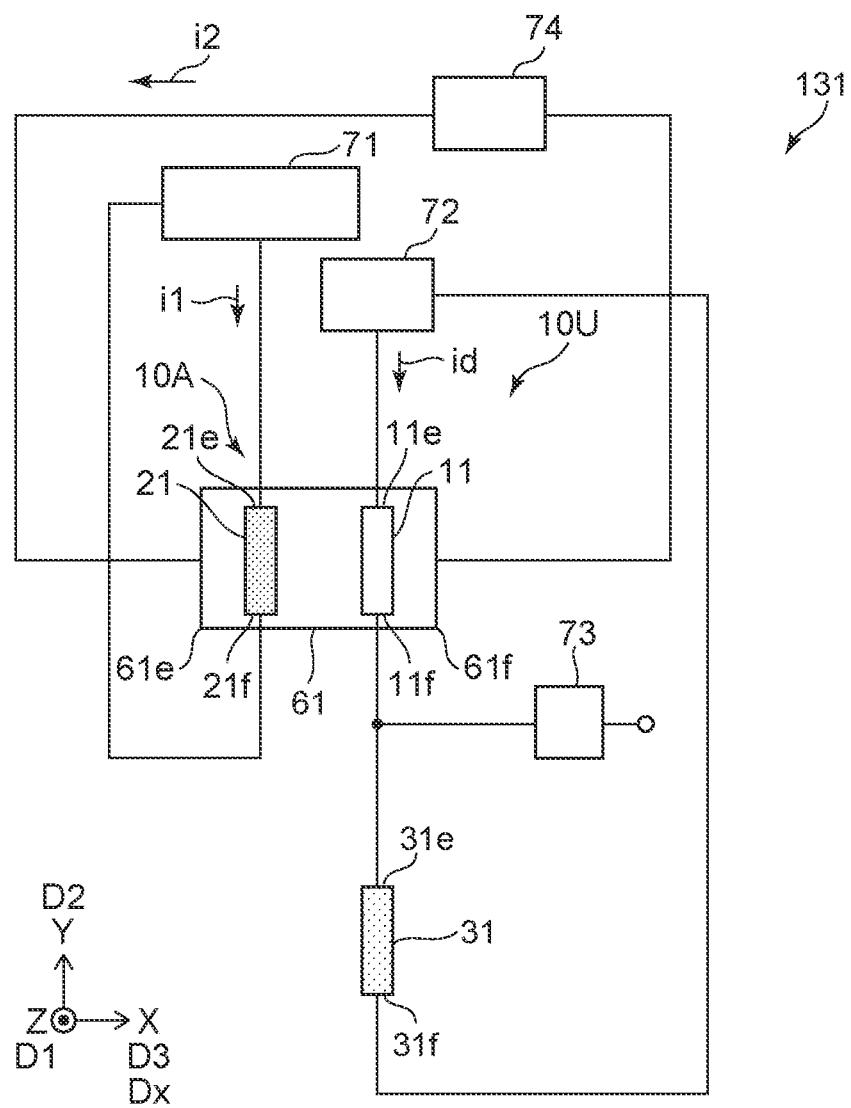
FIG. 22 is a schematic view illustrating a sensor according to the first embodiment.

FIG. 22 is a schematic view illustrating a sensor according to the first embodiment.

As shown in FIG. 22, in a sensor 131, the first element 10A includes the first conductive layer 61. The second current i2 is supplied from the fourth circuit 74 to the first conductive layer 61. Other configurations of the sensor 131 may be the same as those of the sensor 121.

Figure 23:
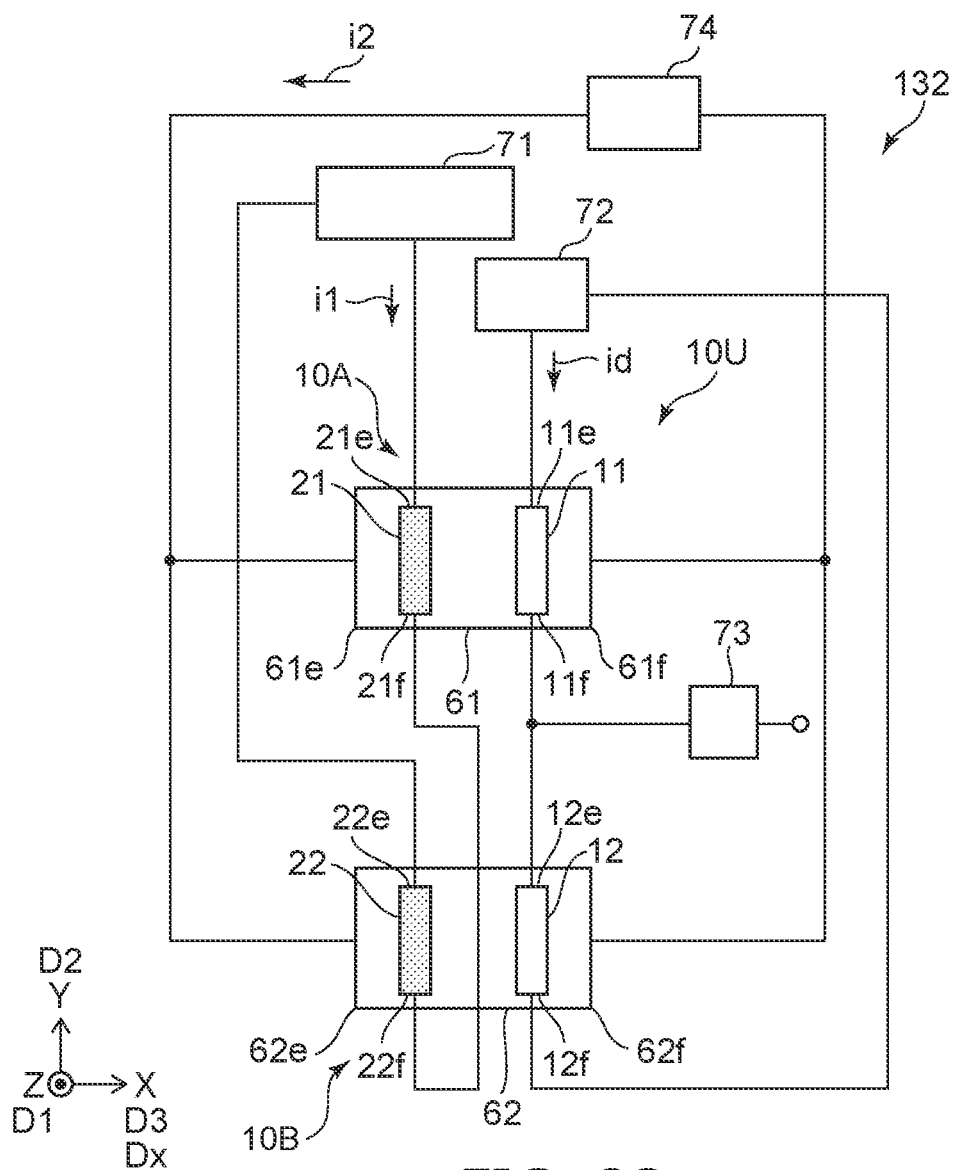
FIG. 23 is a schematic view illustrating a sensor according to the first embodiment.

FIG. 23 is a schematic view illustrating a sensor according to the first embodiment.

As shown in FIG. 23, in a sensor 132, the first element 10A includes the first conductive layer 61 and the second element 10B includes a second conductive layer 62. The second current i2 is supplied from the fourth circuit 74 to the first conductive layer 61 and the second conductive layer 62. Other configurations of the sensor 132 may be the same as those of the sensor 122.

For example, the second conductive layer 62 includes a second conductive layer portion 62e and a second other conductive layer portion 62f. A direction from the second conductive layer portion 62e to the second other conductive layer portion 62f is along the third direction D3. A portion of the second current i2 can flow between the second conductive layer portion 62e and the second other conductive layer portion 62f.

Figure 24:
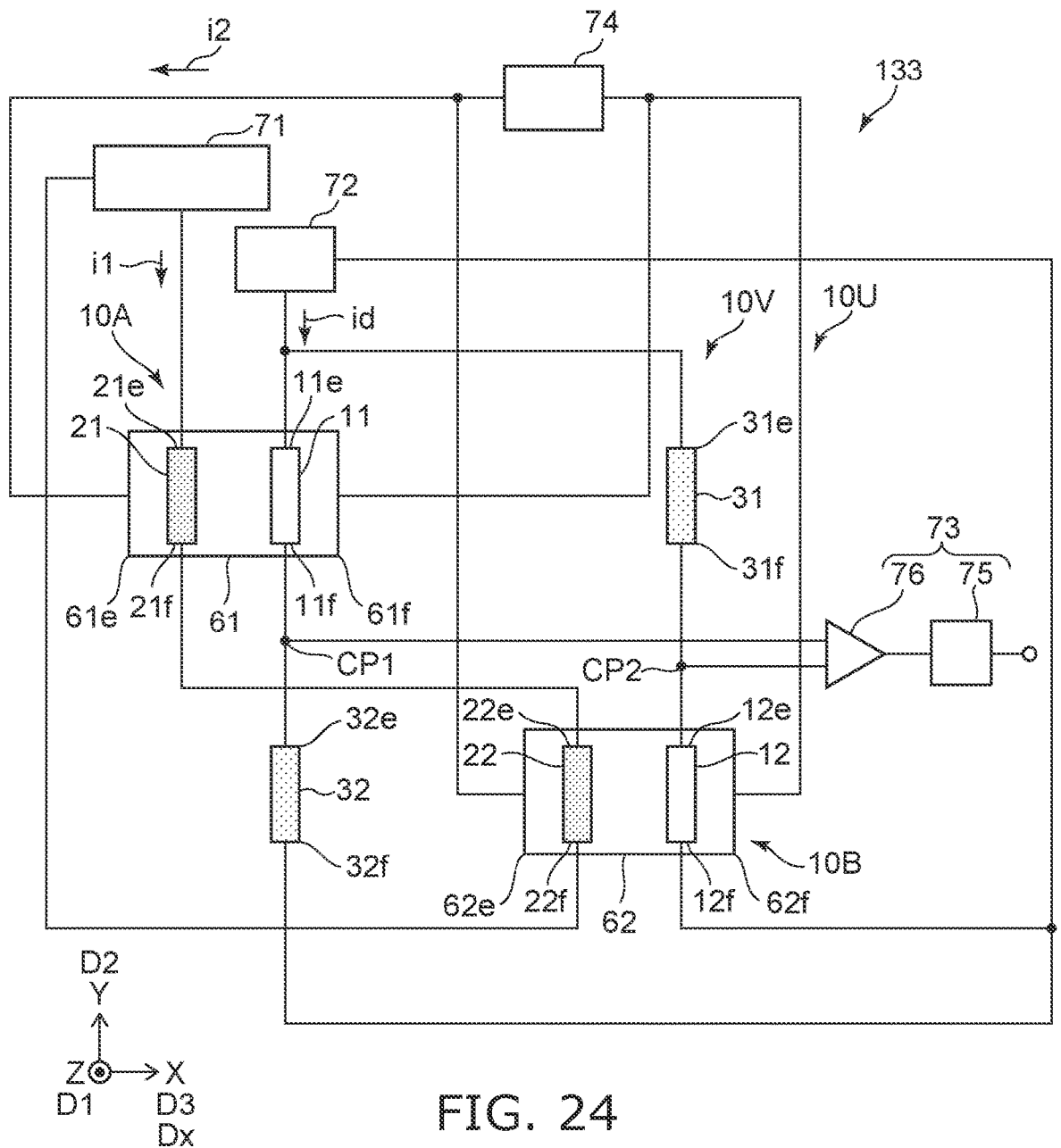
FIG. 24 is a schematic view illustrating a sensor according to the first embodiment.

FIG. 24 is a schematic view illustrating a sensor according to the first embodiment.

As shown in FIG. 24, in a sensor 133, the first element includes the first conductive layer 61 and the second element includes the second conductive layer 62. The second current i2 is supplied from the fourth circuit 74 to the first conductive layer 61 and the second conductive layer 62. Other configurations of the sensor 133 may be the same as those of the sensor 123.

Figure 25:
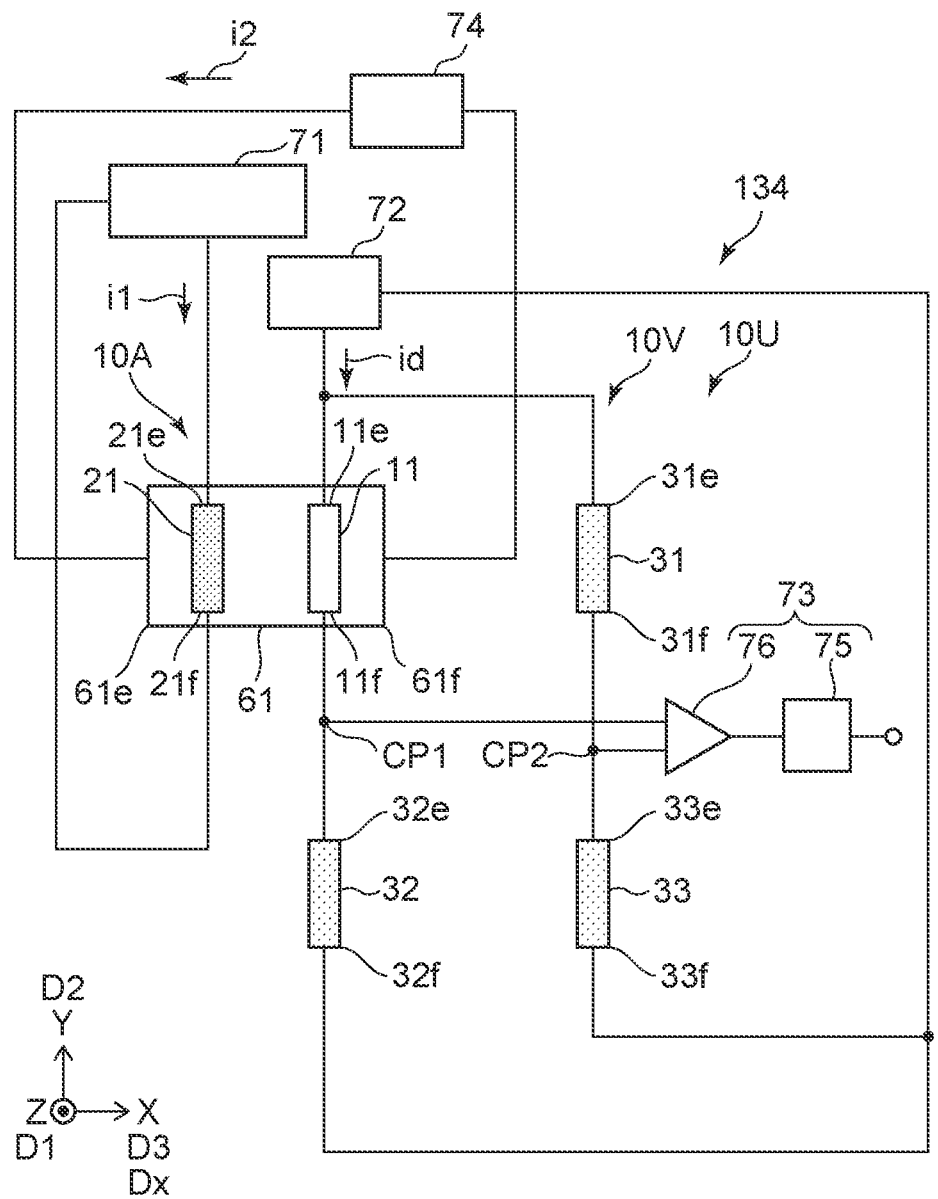
FIG. 25 is a schematic view illustrating a sensor according to the first embodiment.

FIG. 25 is a schematic view illustrating a sensor according to the first embodiment.

As shown in FIG. 25, in a sensor 134, the first element includes the first conductive layer 61. The second current i2 is supplied from the fourth circuit 74 to the first conductive layer 61. Other configurations of the sensor 134 may be the same as those of the sensor 124.

Figure 26:
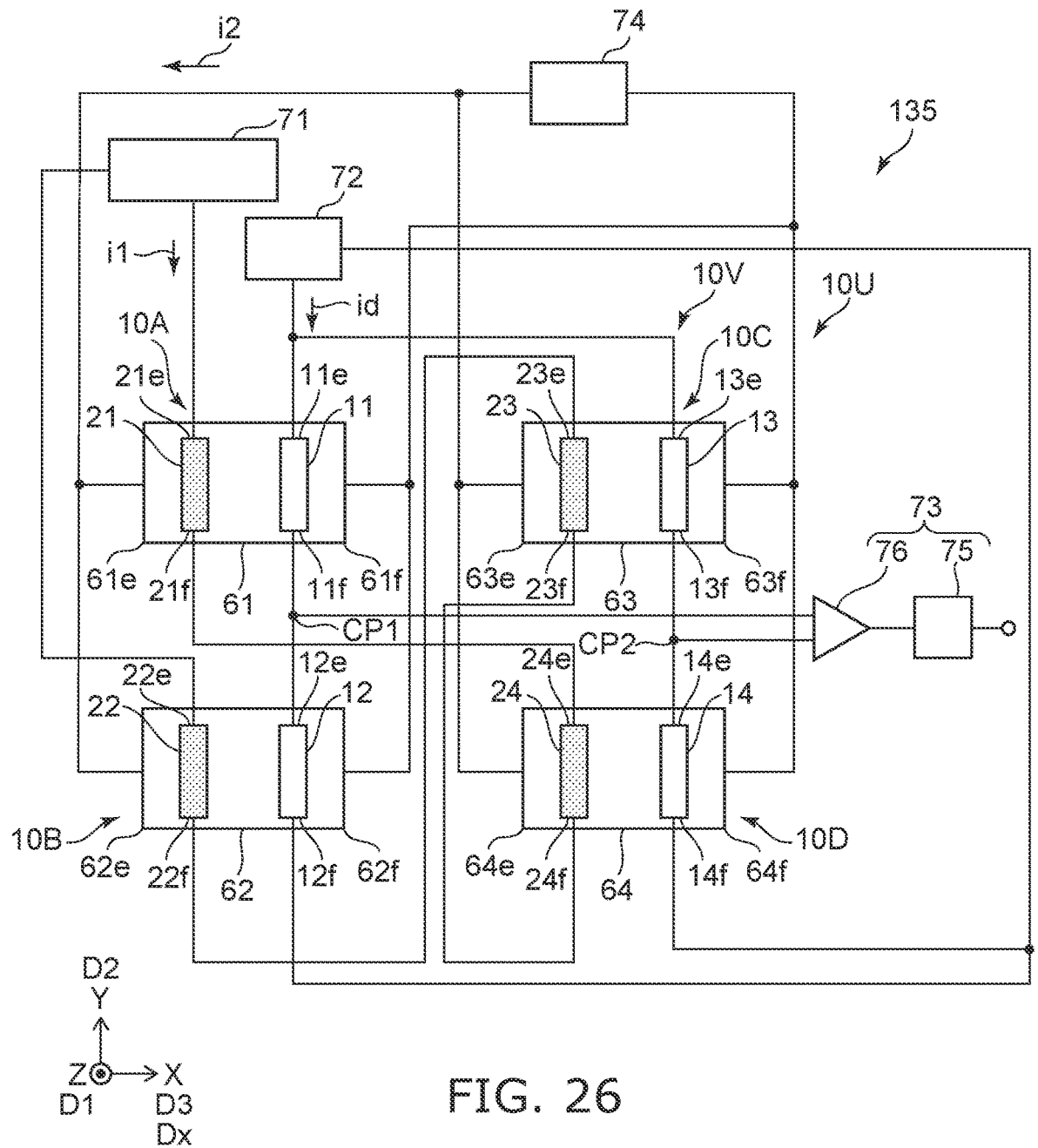
FIG. 26 is a schematic view illustrating a sensor according to the first embodiment.

FIG. 26 is a schematic view illustrating a sensor according to the first embodiment.

As shown in FIG. 26, in a sensor 135, the first element includes the first conductive layer 61. The second element includes the second conductive layer 62. The third element 10C includes a third conductive layer 63. The fourth element includes a fourth conductive layer 64. The second current i2 is supplied from the fourth circuit 74 to these conductive layers. Other configurations of the sensor 135 may be the same as those of the sensor 125.

For example, the third conductive layer 63 includes a third conductive layer portion 63e and a third other conductive layer portion 63f. A direction from the third conductive layer portion 63e to the third other conductive layer portion 63f is along the third direction D3. A portion of the second current i2 is configured to flow between the third conductive layer portion 63e and the third other conductive layer portion 63f.

For example, the fourth conductive layer 64 includes a fourth conductive layer portion 64e and a fourth other conductive layer portion 64f. A direction from the fourth conductive layer portion 64e to the fourth other conductive layer portion 64f is along the third direction D3. A portion of the second current i2 is configured to flow between the fourth conductive layer portion 64e and the fourth other conductive layer portion 64f.

Figure 27:
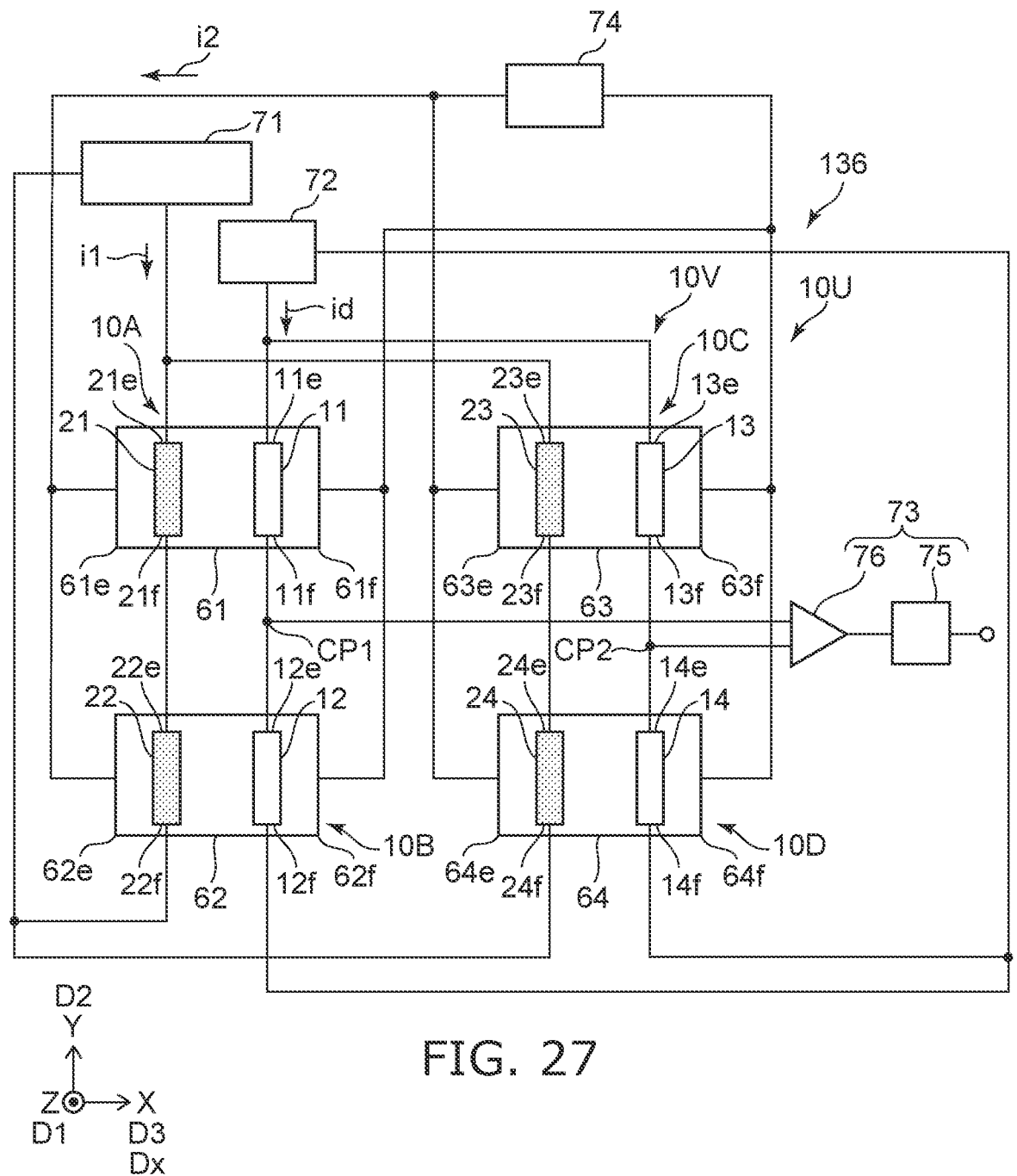
FIG. 27 is a schematic view illustrating a sensor according to the first embodiment.

FIG. 27 is a schematic view illustrating a sensor according to the first embodiment.

As shown in FIG. 27, in a sensor 136, the first element includes the first conductive layer 61. The second element includes the second conductive layer 62. The third element includes the third conductive layer 63. The fourth element includes the fourth conductive layer 64. The second current i2 is supplied from the fourth circuit 74 to these conductive layers. Other configurations of the sensor 136 may be the same as those of the sensor 126.

Second Embodiment

The second embodiment relates to an inspection device. As will be described later, the inspection device may include a diagnostic device.

Figure 28:
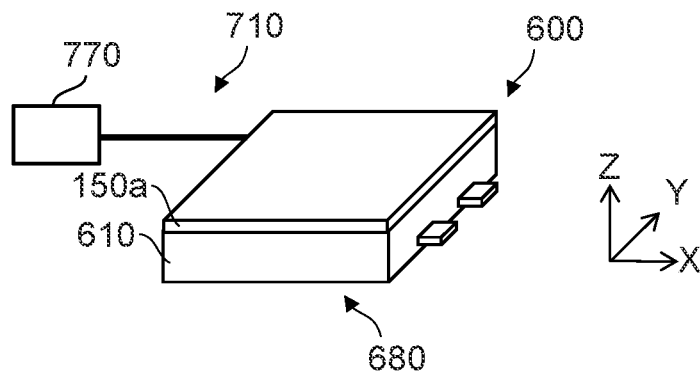
FIG. 28 is a schematic perspective view illustrating an inspection device according to a second embodiment.

FIG. 28 is a schematic perspective view illustrating an inspection device according to a second embodiment.

As shown in FIG. 28, an inspection device 710 according to the embodiment includes a sensor 150a (magnetic sensor) and a processor 770. The sensor 150a may be the sensor according to the first embodiment and a modification thereof. The processor 770 processes an output signal obtained from the sensor 150a. The processor 770 may compare the signal obtained from the sensor 150a with the reference value. The processor 770 can output the inspection result based on the processing result.

For example, the inspection device 710 inspects an inspection object 680. The inspection object 680 is, for example, an electronic device (including a semiconductor circuit or the like). The inspection object 680 may be, for example, a battery 610 or the like.

For example, the sensor 150a according to the embodiment may be used together with the battery 610. For example, a battery system 600 includes the battery 610 and the sensor 150a. The sensor 150a can detect the magnetic field generated by the current flowing through the battery 610.

Figure 29:
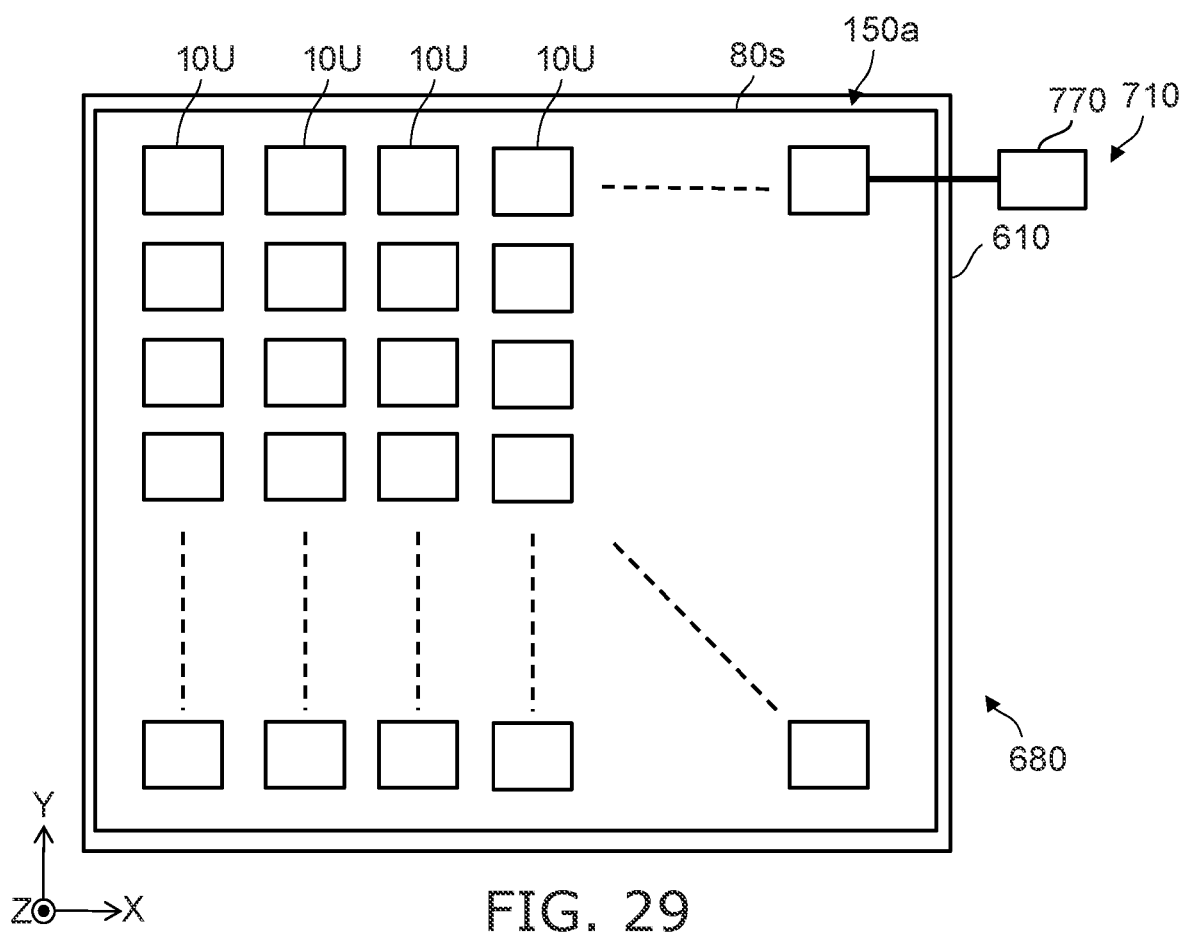
FIG. 29 is a schematic plan view illustrating the inspection device according to the second embodiment.

FIG. 29 is a schematic plan view illustrating the inspection device according to the second embodiment.

As shown in FIG. 29, the sensor 150a includes, for example, multiple sensors according to the embodiment. In this example, the sensor 150a includes multiple sensors (the element portion 10U such as the sensor 110, etc.). The multiple sensors are arranged along, for example, two directions (for example, the X-axis direction and the Y-axis direction). The multiple sensors 110 are provided, for example, on a substrate.

The sensor 150a can detect the magnetic field generated by the current flowing through the inspection object 680 (for example, the battery 610 may be used). For example, when the battery 610 approaches an abnormal state, an abnormal current may start to flow through the battery 610. By detecting the abnormal current with the sensor 150a, it is possible to know the change in the state of the battery 610. For example, in a state where the sensor 150a is placed close to the battery 610, the entire battery 610 can be inspected in a short time by moving the sensor array in two directions. The sensor 150a may be used for inspection of the battery 610 in manufacturing process of the battery 610.

The sensor according to the embodiment can be applied to, for example, the inspection device 710 such as a diagnostic device.

Figure 30:
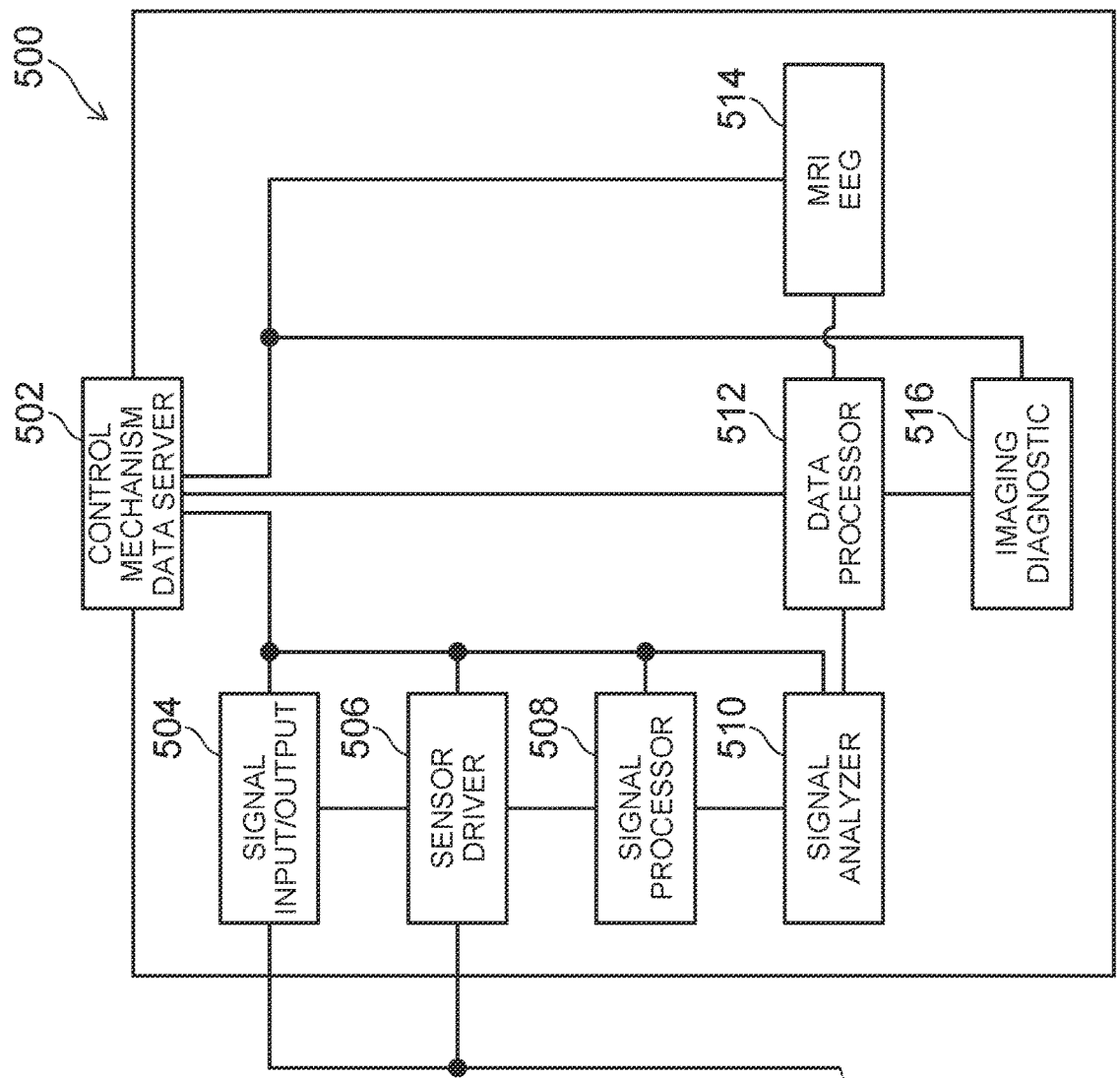
FIG. 30 is a schematic diagram illustrating the sensor and the inspection device according to the embodiment.

FIG. 30 is a schematic diagram illustrating the sensor and the inspection device according to the embodiment.

As shown in FIG. 30, a diagnostic apparatus 500, which is an example of the inspection device 710, includes a sensor 150. The sensor 150 includes the sensors described with respect to the first embodiment and modifications thereof.

In the diagnostic apparatus 500, the sensor 150 is, for example, a magnetoencephalograph. The magnetoencephalograph detects the magnetic field generated by the cranial nerves. When the sensor 150 is used in a magnetoencephalograph, the size of the magnetic element included in the sensor 150 is, for example, not less than 1 mm and less than 10 mm. This size is, for example, the length including an MFC.

As shown in FIG. 30, the sensor 150 (magnetoencephalogram) is attached to, for example, the head of a human body. The sensor 150 (magnetoencephalogram) includes a sensor part 301. The sensor 150 (magnetoencephalogram) may include multiple sensor parts 301. The number of the multiple sensor parts 301 is, for example, about 100 (for example, not less than 50 and not more than 150). The multiple sensor parts 301 are provided on a flexible base body 302.

The sensor 150 may include, for example, a circuit such as differential detection. The sensor 150 may include a sensor other than the sensor (for example, a potential terminal or an acceleration sensor).

A size of the sensor 150 is smaller than a size of a conventional SQUID sensor. Therefore, it is easy to install the multiple sensor parts 301. Installation of the multiple sensor parts 301 and other circuits is easy. The coexistence of the multiple sensor parts 301 and other sensors is easy.

The base body 302 may include an elastic body such as a silicone resin. For example, the multiple sensor parts 301 are provided to be connected to the base body 302. The base body 302 can be in close contact with the head, for example.

The input/output code 303 of the sensor part 301 is connected to a sensor driver 506 and a signal input/output 504 of the diagnostic apparatus 500. The magnetic field measurement is performed in the sensor part 301 based on the electric power from the sensor driver 506 and the control signal from the signal input/output 504. The result is input to the signal input/output 504. The signal obtained by the signal input/output 504 is supplied to a signal processor 508. The signal processor 508 performs processing such as noise removal, filtering, amplification, and signal calculation. The signal processed by the signal processor 508 is supplied to a signal analyzer 510. The signal analyzer 510 extracts, for example, a specific signal for magnetoencephalography measurement. In the signal analyzer 510, for example, signal analysis for matching signal phases is performed.

The output of the signal analyzer 510 (data for which signal analysis has been completed) is supplied to a data processor 512. The data processor 512 performs data analysis. In this data analysis, for example, image data such as MRI (Magnetic Resonance Imaging) can be incorporated. In this data analysis, for example, scalp potential information such as EEG (Electroencephalogram) can be incorporated. For example, a data part 514 such as MRI or EEG is connected to the data processor 512. By the data analysis, for example, nerve ignition point analysis, inverse problem analysis, and the like are performed.

The result of the data analysis is supplied to, for example, an imaging diagnostic 516. Imaging is performed in the imaging diagnostic 516. Imaging assists in diagnosis.

The above series of operations is controlled by, for example, a control mechanism 502. For example, necessary data such as primary signal data or metadata in the middle of data processing is stored in the data server. The data server and the control mechanism may be integrated.

The diagnostic apparatus 500 according to the embodiment includes the sensor 150 and the processor that processes an output signal obtained from the sensor 150. This processor includes, for example, at least one of a signal processor 508 or a data processor 512. The processor includes, for example, a computer.

In the sensor 150 shown in FIG. 30, the sensor part 301 is installed on the head of the human body. The sensor part 301 may be installed on the chest of the human body. This enables magnetocardiography measurement. For example, the sensor part 301 may be installed on the abdomen of a pregnant woman. This makes it possible to perform a fetal heartbeat test.

The sensor device including the subject is preferably installed in a shield room. Thereby, for example, the influence of geomagnetism or magnetic noise can be suppressed.

For example, a mechanism for locally shielding the measurement site of the human body or the sensor part 301 may be provided. For example, the sensor part 301 may be provided with a shield mechanism. For example, effective shielding may be performed in the signal analysis or the data processing.

In embodiments, the base body 302 may be flexible and may be substantially non-flexible. In the example shown in FIG. 30, the base body 302 is a continuous film processed into a hat shape. The base body 302 may be in a net shape. Thereby, for example, good wearability can be obtained. For example, the adhesion of the base body 302 to the human body is improved. The base body 302 may be helmet-shaped and may be rigid.

Figure 31:
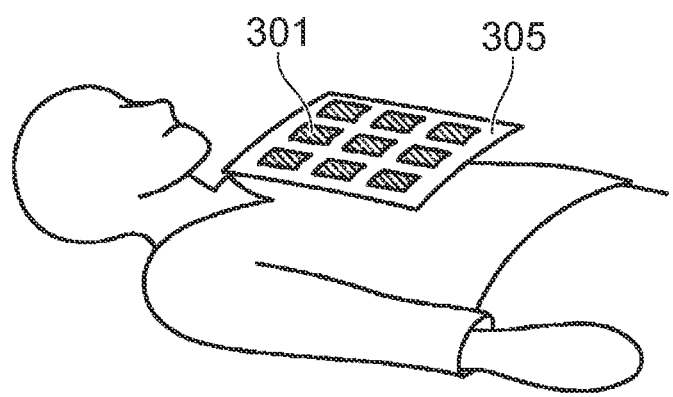
FIG. 31 is a schematic view illustrating the inspection device according to the embodiment.

FIG. 31 is a schematic view illustrating the inspection device according to the embodiment.

In the example shown in FIG. 31, the sensor part 301 is provided on a flat plate-shaped hard base body 305.

In the example shown in FIG. 31, the input/output of the signal obtained from the sensor part 301 is the same as the input/output described with respect to FIG. 31. In the example shown in FIG. 31, the processing of the signal obtained from the sensor part 301 is the same as the processing described with respect to FIG. 30.

There is a reference example of using a SQUID (Superconducting Quantum Interference Device) sensor as a device for measuring a weak magnetic field such as a magnetic field generated from a living body. In this reference example, since superconductivity is used, the device is large and the power consumption is also large. The burden on the measurement target (patient) is heavy.

According to the embodiment, the device can be downsized. Power consumption can be suppressed. The burden on the measurement object (patient) can be reduced. According to the embodiment, the SN ratio of magnetic field detection can be improved. Sensitivity can be improved.

The embodiments may include the following configurations (for example, technical proposals).

Configuration 1

A sensor, comprising:
an element portion including a first element,
the first element including a first magnetic element, a first conductive member, and a first magnetic portion,
the first magnetic element including a first magnetic layer and a first opposing magnetic layer,
a length of the first magnetic element along a second direction crossing a first direction from the first magnetic layer to the first opposing magnetic layer being longer than a length of the first magnetic element along a third direction crossing a plane including the first direction and the second direction,
the first conductive member including a first conductive portion and a first other conductive portion,
a direction from the first other conductive portion to the first conductive portion being along the second direction, and
a direction from the first magnetic portion to the first magnetic element being along the second direction.

Configuration 2

The sensor according to Configuration 1, wherein a length of the first magnetic portion along the third direction is longer than the length of the first magnetic element along the third direction.

Configuration 3

The sensor according to Configuration 1 or 2, wherein the first magnetic portion includes a ferromagnetic material.

Configuration 4

The sensor according to any one of Configurations 1 to 3, wherein
the first element further includes a first opposing magnetic portion, and
at least a part of the first magnetic element is between the first magnetic portion and the first opposing magnetic portion in the second direction.

Configuration 5
 The sensor according to Configuration 4, wherein
  an orientation of a magnetization of the first magnetic portion includes a component in the second direction,
  an orientation of a magnetization of the first opposing magnetic portion includes a component in the second direction, and
  the orientation of the magnetization of the first magnetic portion is same as the orientation of the magnetization of the first opposing magnetic portion.

Configuration 6
 The sensor according to any one of Configurations 1 to 5, further comprising a controller including a first circuit,
  the first circuit being electrically connected to the first conductive portion and the first other conductive portion,
  the first circuit being configured to supply a first current to the first conductive member,
  the first current including an AC component,
  a local minimum value of the first current being of a first polarity, and
  a local maximum value of the first current being of the first polarity.

Configuration 7
 The sensor according to Configuration 6, wherein
  the controller includes a second circuit and a third circuit,
  the second circuit is configured to supply a detection current to the first magnetic element, and
  the third circuit is configured to detect a value corresponding to a change in a first electrical resistance of the first magnetic element.

Configuration 8
 A sensor, comprising:
  an element portion including a first element,
  the first element including a first magnetic element, a first conductive member, and a first magnetic portion,
  the first magnetic element including a first magnetic layer and a first opposing magnetic layer,
  a length of the first magnetic element along a second direction crossing a first direction from the first magnetic layer to the first opposing magnetic layer being longer than a length of the first magnetic element along a third direction crossing a plane including the first direction and the second direction,
  the first conductive member including a first conductive portion and a first other conductive portion,
  a direction from the first other conductive portion to the first conductive portion being along the second direction,
  the first conductive layer overlapping the first magnetic element in the first direction,
  the first conductive layer including a first conductive layer portion and a first other conductive layer portion,
  a direction from the first conductive layer portion to the first other conductive layer portion being along the third direction,
  a second current being configured to flow between the first conductive layer portion and the first other conductive layer portion.

Configuration 9
 The sensor according to Configuration 8, further comprising a fourth circuit, and
  the fourth circuit being configured to supply the second current to the first conductive layer.

Configuration 10
 The sensor according to Configuration 8 or 9, wherein a length of the first conductive layer along the second direction is greater than the length of the first magnetic element along the second direction.

Configuration 11
 The sensor according to any one of Configurations 8 to 10, further comprising a controller including a first circuit,
  the first circuit being electrically connected to the first conductive portion and the first other conductive portion,
  the first circuit being configured to supply a first current to the first conductive member,
  the first current including an AC component,
  a local minimum value of the first current being of a first polarity, and
  the local maximum value of the first current being of the first polarity.

Configuration 12
 The sensor according to Configuration 11, wherein
  the controller includes a second circuit and a third circuit,
  the second circuit is configured to supply a detection current to the first magnetic element, and
  the third circuit is configured to detect a value corresponding to a change in a first electrical resistance of the first magnetic element.

Configuration 13
 A sensor, comprising:
  an element portion including a first element,
  the first element including a first magnetic element, a first conductive member, and a first magnetic portion,
  the first magnetic element including a first magnetic layer and a first opposing magnetic layer,
  a length of the first magnetic element along a second direction crossing a first direction from the first magnetic layer to the first opposing magnetic layer being longer than a length of the first magnetic element along a third direction crossing a plane including the first direction and the second direction,
  the first conductive member including a first conductive portion and a first other conductive portion,
  a direction from the first other conductive portion to the first conductive portion being along the second direction, and
  a direction from the first magnetic portion to the first magnetic element being along the third direction.

Configuration 14
 The sensor according to Configuration 13, wherein a length of the first magnetic portion along the second direction is longer than the length of the first magnetic element along the second direction.

Configuration 15
 The sensor according to Configuration 13 or 14, wherein the first magnetic portion includes a ferromagnetic material.

Configuration 16
 The sensor according to any one of Configurations 13 to wherein the first element further includes a first opposing magnetic portion, and
  at least a part of the first magnetic element is between the first magnetic portion and the first opposing magnetic portion in the third direction.

Configuration 17
 The sensor according to Configuration 16, wherein
  an orientation of a magnetization of the first magnetic portion includes a component in the third direction,
  an orientation of a magnetization of the first opposing magnetic portion includes a component in the third direction, and the orientation of the magnetization of the first magnetic portion is same as the orientation of the magnetization of the first opposing magnetic portion.

Configuration 18

The sensor according to any one of Configurations 13 to 17, further comprising a controller including a first circuit,
the first circuit being electrically connected to the first conductive portion and the first other conductive portion,
the first circuit being configured to supply a first current to the first conductive member, and
the first current including an AC component.

Configuration 19

The sensor according to Configuration 18, wherein
the controller includes a second circuit and a third circuit,
the second circuit is configured to supply a detection current to the first magnetic element, and
the third circuit is configured to detect a value corresponding to a change in a first electrical resistance of the first magnetic element.

Configuration 20

An inspection device, comprising:
the sensor according to any one of Configurations 1 to 19; and
a processor configured to process an output signal obtained from the sensor.

According to the embodiments, it is possible to provide a sensor and an inspection device capable of improving characteristics.

In the present specification, "perpendicular" and "parallel" include not only strict perpendicularity and strict parallelism, but also variations in the manufacturing process, for example, and may be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in the sensors or the inspection devices such as magnetic layers, magnetic elements, conductive members, controllers, processors, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all sensors and all inspection devices practicable by an appropriate design modification by one skilled in the art based on the sensors and the inspection devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A sensor, comprising:
an element portion including a first element,
the first element including a first magnetic element, a first conductive member, and a first magnetic portion,
the first magnetic element including a first magnetic layer and a first opposing magnetic layer,
a length of the first magnetic element along a second direction crossing a first direction from the first magnetic layer to the first opposing magnetic layer being longer than a length of the first magnetic element along a third direction crossing a plane including the first direction and the second direction,
the first conductive member including a first conductive portion and a first other conductive portion,
a direction from the first other conductive portion to the first conductive portion being along the second direction, and
a direction from the first magnetic portion to the first magnetic element being along the second direction.

2. The sensor according to claim 1, wherein a length of the first magnetic portion along the third direction is longer than the length of the first magnetic element along the third direction.

3. The sensor according to claim 1, wherein the first magnetic portion includes a ferromagnetic material.

4. The sensor according to claim 1, wherein
the first element further includes a first opposing magnetic portion, and
at least a part of the first magnetic element is between the first magnetic portion and the first opposing magnetic portion in the second direction.

5. The sensor according to claim 4, wherein
an orientation of a magnetization of the first magnetic portion includes a component in the second direction,
an orientation of a magnetization of the first opposing magnetic portion includes a component in the second direction, and
the orientation of the magnetization of the first magnetic portion is same as the orientation of the magnetization of the first opposing magnetic portion.

6. The sensor according to claim 1, further comprising a controller including a first circuit,
the first circuit being electrically connected to the first conductive portion and the first other conductive portion,
the first circuit being configured to supply a first current to the first conductive member,
the first current including an AC component,
a local minimum value of the first current being of a first polarity, and
a local maximum value of the first current being of the first polarity.

7. The sensor according to claim 6, wherein
the controller includes a second circuit and a third circuit,
the second circuit is configured to supply a detection current to the first magnetic element, and
the third circuit is configured to detect a value corresponding to a change in a first electrical resistance of the first magnetic element.

8. A sensor, comprising:
an element portion including a first element,
the first element including a first magnetic element, a first conductive member, and a first magnetic portion,
the first magnetic element including a first magnetic layer and a first opposing magnetic layer,
a length of the first magnetic element along a second direction crossing a first direction from the first magnetic layer to the first opposing magnetic layer being longer than a length of the first magnetic element along a third direction crossing a plane including the first direction and the second direction,
the first conductive member including a first conductive portion and a first other conductive portion,
a direction from the first other conductive portion to the first conductive portion being along the second direction,
the first conductive layer overlapping the first magnetic element in the first direction,
the first conductive layer including a first conductive layer portion and a first other conductive layer portion,
a direction from the first conductive layer portion to the first other conductive layer portion being along the third direction,
a second current being configured to flow between the first conductive layer portion and the first other conductive layer portion.

9. The sensor according to claim 8, further comprising a fourth circuit, and
the fourth circuit being configured to supply the second current to the first conductive layer.

10. The sensor according to claim 8, wherein a length of the first conductive layer along the second direction is greater than the length of the first magnetic element along the second direction.

11. The sensor according to claim 8, further comprising a controller including a first circuit,
the first circuit being electrically connected to the first conductive portion and the first other conductive portion,
the first circuit being configured to supply a first current to the first conductive member,
the first current including an AC component,
a local minimum value of the first current being of a first polarity, and
the local maximum value of the first current being of the first polarity.

12. The sensor according to claim 11, wherein
the controller includes a second circuit and a third circuit,
the second circuit is configured to supply a detection current to the first magnetic element, and
the third circuit is configured to detect a value corresponding to a change in a first electrical resistance of the first magnetic element.

13. A sensor, comprising:
an element portion including a first element,
the first element including a first magnetic element, a first conductive member, and a first magnetic portion,
the first magnetic element including a first magnetic layer and a first opposing magnetic layer,
a length of the first magnetic element along a second direction crossing a first direction from the first magnetic layer to the first opposing magnetic layer being longer than a length of the first magnetic element along a third direction crossing a plane including the first direction and the second direction,
the first conductive member including a first conductive portion and a first other conductive portion,
a direction from the first other conductive portion to the first conductive portion being along the second direction, and
a direction from the first magnetic portion to the first magnetic element being along the third direction.

14. The sensor according to claim 13, wherein a length of the first magnetic portion along the second direction is longer than the length of the first magnetic element along the second direction.

15. The sensor according to claim 13, wherein the first magnetic portion includes a ferromagnetic material.

16. The sensor according to claim 13, wherein the first element further includes a first opposing magnetic portion, and
at least a part of the first magnetic element is between the first magnetic portion and the first opposing magnetic portion in the third direction.

17. The sensor according to claim 16, wherein
an orientation of a magnetization of the first magnetic portion includes a component in the third direction,
an orientation of a magnetization of the first opposing magnetic portion includes a component in the third direction, and
the orientation of the magnetization of the first magnetic portion is same as the orientation of the magnetization of the first opposing magnetic portion.

18. The sensor according to claim 13, further comprising a controller including a first circuit,
the first circuit being electrically connected to the first conductive portion and the first other conductive portion,
the first circuit being configured to supply a first current to the first conductive member, and
the first current including an AC component.

19. The sensor according to claim 18, wherein
the controller includes a second circuit and a third circuit,
the second circuit is configured to supply a detection current to the first magnetic element, and
the third circuit is configured to detect a value corresponding to a change in a first electrical resistance of the first magnetic element.

20. An inspection device, comprising:
the sensor according to claim 1; and
a processor configured to process an output signal obtained from the sensor.

* * * * *